US009793511B2

(12) United States Patent
Mihara et al.

(10) Patent No.: US 9,793,511 B2
(45) Date of Patent: Oct. 17, 2017

(54) FILLER MATERIAL FOR ORGANIC ELECTROLUMINESCENT ELEMENT AND METHOD OF SEALING ORGANIC ELECTROLUMINESCENT ELEMENT

(71) Applicant: FURUKAWA ELECTRIC CO., LTD., Tokyo (JP)

(72) Inventors: Naoaki Mihara, Tokyo (JP); Yasushi Ishizaka, Tokyo (JP); Tetsuya Mieda, Tokyo (JP); Kunihiko Ishiguro, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 0 days.

(21) Appl. No.: 15/190,833

(22) Filed: Jun. 23, 2016

(65) Prior Publication Data

US 2016/0308164 A1 Oct. 20, 2016

Related U.S. Application Data

(63) Continuation of application No. PCT/JP2014/083547, filed on Dec. 18, 2014.

(30) Foreign Application Priority Data

Dec. 27, 2013 (JP) .................. 2013-271025

(51) Int. Cl.
*H01L 21/00* (2006.01)
*H01L 21/47* (2006.01)
(Continued)

(52) U.S. Cl.
CPC .......... *H01L 51/5253* (2013.01); *C08K 5/057* (2013.01); *C08L 23/22* (2013.01);
(Continued)

(58) Field of Classification Search
None
See application file for complete search history.

(56) References Cited

U.S. PATENT DOCUMENTS 6,268,695 B1 7/2001 Affinito
8,809,442 B2* 8/2014 Kageyama ............ H05B 33/04
524/500

(Continued)

FOREIGN PATENT DOCUMENTS

JP   58-147191 U   10/1983
JP   2002-33187 A   1/2002
(Continued)

OTHER PUBLICATIONS

International Search Report, issued in PCT/JP2014/083547, dated Mar. 24, 2015.
(Continued)

*Primary Examiner* — Sitaramarao S Yechuri
(74) *Attorney, Agent, or Firm* — Birch, Stewart, Kolasch & Brich, LLP

(57) ABSTRACT

A filler material for an organic electroluminescent element, formed of a resin composition being liquid at 25° C., and containing a hydrocarbon polymer having a number average molecular weight of 300 or more and less than 32,000 and an organometallic compound represented by $M\text{-}L_n$ (wherein, M represents a metal atom; L represents an organic group having 9 or more carbon atoms and 1 or more oxygen atoms, and all of L represent the same organic group; and n represents the valence of a metal atom M), wherein a contact angle to silicon nitride is 10 to 40 degrees, and an amount of outgassing other than moisture upon heating at 85° C. for 1 hour is 500 ppm or less in terms of a toluene equivalent, and a method of sealing an organic electroluminescent element using the same.

20 Claims, 2 Drawing Sheets

(51) Int. Cl.

| | | |
|---|---|---|
| H01L 21/54 | (2006.01) | |
| H01L 21/56 | (2006.01) | |
| H01L 51/52 | (2006.01) | |
| H01L 51/00 | (2006.01) | |
| C08K 5/057 | (2006.01) | |
| C08L 23/22 | (2006.01) | |
| H01L 51/56 | (2006.01) | |

(52) U.S. Cl.
CPC ........ *H01L 51/004* (2013.01); *H01L 51/0081* (2013.01); *H01L 51/524* (2013.01); *H01L 51/56* (2013.01); *H01L 2251/5369* (2013.01)

(56) References Cited

U.S. PATENT DOCUMENTS

| | | | | |
|---|---|---|---|---|
| 2002/0015818 | A1 | 2/2002 | Takahashi et al. | |
| 2005/0023960 | A1* | 2/2005 | Harada | H01L 51/5246 313/502 |
| 2009/0026934 | A1* | 1/2009 | Fujita | C09J 7/021 313/504 |
| 2009/0140643 | A1* | 6/2009 | Ohsawa | C09K 11/06 313/504 |
| 2011/0105637 | A1* | 5/2011 | Fujita | C08L 23/22 522/120 |
| 2012/0037893 | A1 | 2/2012 | Tanaka et al. | |
| 2012/0248969 | A1* | 10/2012 | Inoue | C09K 11/06 313/504 |
| 2012/0261613 | A1 | 10/2012 | Kim et al. | |
| 2012/0283375 | A1 | 11/2012 | Kageyama | |
| 2013/0193842 | A1* | 8/2013 | Hoshina | B01J 20/262 313/504 |
| 2014/0179869 | A1* | 6/2014 | Ko | G02B 1/04 524/770 |
| 2014/0367650 | A1* | 12/2014 | Kim | H01L 51/0085 257/40 |
| 2015/0240133 | A1* | 8/2015 | Nakayama | C09J 7/00 428/523 |
| 2015/0240134 | A1* | 8/2015 | Keite-Telgenbuscher | C09J 127/16 156/322 |

FOREIGN PATENT DOCUMENTS

| | | |
|---|---|---|
| JP | 2005-11648 A | 1/2005 |
| JP | 2006-228519 A | 8/2006 |
| JP | 2008-59868 A | 3/2008 |
| JP | 2008-305580 A | 12/2008 |
| JP | 2010-80289 A | 4/2010 |
| JP | 4628210 B2 | 2/2011 |
| JP | 2011-159629 A | 8/2011 |
| JP | 2012-38659 A | 2/2012 |
| JP | 2012-38660 A | 2/2012 |
| JP | 5074423 B2 | 11/2012 |
| JP | 2013-502312 A | 1/2013 |
| JP | 5144041 B2 | 2/2013 |
| JP | 2013-48115 A | 3/2013 |
| TW | 201100478 A1 | 1/2011 |
| WO | WO 2011/062167 A1 | 5/2011 |

OTHER PUBLICATIONS

Japanese Office Action dated Sep. 2, 2014 of the Priority Application No. 2013-271025.
Written Opinion of the International Searching Authority, issued in PCT/JP2014/083547, dated Mar. 24, 2015.
Taiwanese Office Action and Taiwanese Search Report, dated Jun. 22, 2016, for Taiwanese Application No. 103145168, along with English translations.

* cited by examiner

| Kind of particles | Spherical silica | Synthetic smectite | Fumed Silica |
|---|---|---|---|
| TEM image |  50nm |  50nm |  50nm |
| mean particle size | 15nm | 40um | 60um |
| Fractal dimensions of contour lines | 1.0 | 1.1 | 1.3~1.4 |

FILLER MATERIAL FOR ORGANIC ELECTROLUMINESCENT ELEMENT AND METHOD OF SEALING ORGANIC ELECTROLUMINESCENT ELEMENT

CROSS-REFERENCE TO RELATED APPLICATIONS

This application is a continuation of PCT/JP2014/083547 filed on Dec. 18, 2014 which claims benefit of Japanese Patent Application No. 2013-271025 filed on Dec. 27, 2013, the subject matters of which are incorporated herein by reference in their entirety.

TECHNICAL FIELD

The present invention relates to a liquid filler material that protects an organic electroluminescent element (also called OLED or OLED element) such as an organic light-emitting diode from moisture, is excellent in working efficiency during application, has a limited amount of outgassing component, and can be used without adversely affecting visibility of a display, and a method of sealing an OLED using the same.

BACKGROUND ART

In recent years, development of an organic electroluminescent element to a display, illumination or the like has been progressing.

While an OLED is attractive in an excellent chromogenic property and an excellent energy-saving property, specific examples of a most significant challenge include poorness of durability. In particular, occurrence of a non-light-emitting portion called a dark-spot caused by moisture has posed a problem.

Consequently, as a method for allowing no invasion of moisture into an OLED, for example, Patent Literature 1 proposes a method in which an OLED is sealed inside a hollow airtight vessel to fill a space inside this airtight vessel with an inert gas atmosphere.

Moreover, for example, Patent Literatures 2 and 3 also propose a method in which a protective layer or the like composed of an inorganic substance having low moisture permeability typified by silicon nitride is provided on an OLED layer or a light-emitting part of an OLED.

However, according to a method of filling an inert gas inside the airtight vessel, a heat dissipation property is insufficient, and therefore such a method will adversely affect a life of an OLED, on the contrary. Therefore, the method has had a problem of incapability of sufficiently extending the life.

Moreover, formation of a film of the protective layer composed of the inorganic substance without a microscopic defect is significantly difficult by a current technology, and a problem of occurring the dark-spot under a high temperature and high humidity environment has still remained. In order to solve the above problem, it also may make attempt to form a protective layer having multilayer structure, for example by frequently repeating a method of forming a defect flattening layer on the protective layer composed of the inorganic substance, and then further stacking another protective layer composed of the inorganic substance thereon. However, application of such a method to a display and illumination for a general household has had a major challenge in view of labor and cost.

Patent Literatures 4 and 5 propose an art in which moisture-proof oil such as silicone oil or a curable resin is used as a filler in place of the inert gas.

However, the method in which the moisture-proof oil or the curable resin is filled therein has had a problem of generating gas bubbles inside the airtight vessel by outgassing caused by volatilization of a low molecular weight organic component, a solvent or the like contained in the moisture-proof oil or the curable resin to adversely affect aesthetic appearance (also referred to as visibility) of a display. Moreover, outgassing is permeated into organic molecules that form the OLED layer to cause a problem of an increase of a risk of occurring the dark-spot.

Furthermore, even if the moisture-proof oil or the curable resin is used in combination with the protective layer, an influence of moisture is unable to be completely eliminated, and the dark-spot is still occurred particularly under the high temperature and high humidity environment over a long period of time.

Therefore, for example, Patent Literatures 6 and 7 also propose a method in which hygroscopic metal oxide such as calcium oxide and magnesium oxide is added to a curable resin or the like to provide a filler with drying capability.

However, when the curable resin or the like is used as the filler, an OLED element is easily broken by cure shrinkage of the curable resin or the like, and a breakage risk during cure has posed a problem.

In the meantime, if the filler provided with the drying capability is transparent and colorless, such a filler can also be applied to a so-called "top emission type" OLED element in which light generated in the OLED element is emitted from a side of a sealing substrate (counter substrate), and not from side of a TFT substrate. In the top emission type OLED element, no emitted light is shielded by TFT. Therefore, in comparison with a so-called "bottom emission type" one, light-emitting efficiency is higher, and if "top emission type" one is applied to an image display apparatus, for example, "top emission type" one is advantageous in view of obtaining an image having higher luminance.

As such a filler that is transparent and colorless and has drying capability, for example, Patent Literatures 8 to 11 propose an organometallic compound such as aluminum oxide alkoxide and a mixture thereof with a resin.

CITATION LIST

Patent Literatures

Patent Literature 1: JP-A-2002-33187 ("JP-A" means unexamined published Japanese patent application)
Patent Literature 2: JP-A-2005-11648
Patent Literature 3: JP-A-2011-159629
Patent Literature 4: JU-A-S58-147191 ("JU-A" means unexamined published Japanese utility model registration application)
Patent Literature 5: JP-A-2013-048115
Patent Literature 6: International Publication No. WO 2011/62167 pamphlet
Patent Literature 7: JP-B-5144041 ("JP-B" means examined Japanese patent publication)
Patent Literature 8: JP-A-2012-38659
Patent Literature 9: JP-B-4628210
Patent Literature 10: JP-A-2012-38660
Patent Literature 11: 2013-502312

SUMMARY OF INVENTION

Technical Problem

All of organometallic compounds or the like described in Patent Literatures 8 to 11 are used in the form of a liquid filler during being filled. However, the filler insufficiently spreads on a surface of a protective layer composed of an inorganic substance, or part of low molecular weight organic component contained in the filler is outgassed. Thus, a gas bubble-like defect is partially caused in several cases. Such a defect adversely affects aesthetic appearance of an OLED, and has served as one of factors of decreasing a yield of producing a device using an OLED, for example an image display apparatus such as a flat panel.

The present invention is contemplated for solving the above-described problem, and providing a filler material that protects an OLED element from moisture, has no breakage risk of the OLED element by cure shrinkage, and can be applied and filled without any defect onto a surface of an insulating protective layer, and a method of sealing an OLED using the same.

Solution to Problem

In the course of studying various combinations of resins serving as a base, and drying agents for a filler material having a capability of drying moisture, the present inventors found that a specific hydrocarbon polymer and a specific organometallic compound are used, and a contact angle and an amount of outgassing are set up in a specific range to facilitate application and filling of the filler material, to keep initial drying capability even in a liquid state, and also to eliminate necessity of cure after being filled and to allow avoidance of a breakage risk. The present invention has been completed based on this finding.

The above-described problems can be solved by the following means.

[1] A filler material for an organic electroluminescent element, formed of a resin composition being liquid at 25° C., and containing a hydrocarbon polymer having a number average molecular weight of 300 or more and less than 32,000 and an organometallic compound represented by Formula 1, wherein a contact angle to silicon nitride is 10 to 40 degrees, and an amount of outgassing other than moisture upon heating at 85° C. for 1 hour is 500 ppm or less in terms of a toluene equivalent;

$$M\text{-}L_n \qquad \text{Formula (1)}$$

wherein, in Formula (1), M represents a metal atom; L represents an organic group having 9 or more carbon atoms and 1 or more oxygen atoms, and all of L represent the same organic group; and n represents the valence of a metal atom M.

[2] The filler material for the organic electroluminescent element described in the above item [1], wherein the organic group L is an organic group derived from aliphatic alcohol.

[3] The filler material for the organic electroluminescent element described in the above item [1], wherein the organic group L is an organic group derived from β-diketone, β-ketoester or malonic diester.

[4] The filler material for the organic electroluminescent element described in any one of the above items [1] to [3], wherein the metal atom M is a metal atom belonging to any one of group 2 to group 4 and group 11 to group 14 in the long periodic table of elements.

[5] The filler material for the organic electroluminescent element described in any one of the above items [1] to [4], wherein at least one kind of the hydrocarbon polymer is polyisobutylene.

[6] The filler material for the organic electroluminescent element described in any one of the above items [1] to [5], wherein at least one kind of the hydrocarbon polymer is a polymer of cyclic unsaturated hydrocarbon or a hydrogenated product thereof, having a number average molecular weight of 300 or more and less than 1,000.

[7] The filler material for the organic electroluminescent element described in any one of the above items [1] to [6], wherein the filler material is a non-Newtonian fluid at 25° C. and at a shear rate in a region of 0.1 to 1000 $S^{-1}$.

[8] The filler material for the organic electroluminescent element described in any one of the above items [1] to [7], wherein total luminous transmittance in a wavelength region of 350 to 800 nm is 90% or more at a path length of 25 μm.

[9] The filler material for the organic electroluminescent element described in the above item [8], wherein total luminous transmittance in a wavelength region of 350 to 800 nm after storage at 60° C. for 100 hours under an environment of 90% RH is 80% or more at a path length of 25 μm.

[10] The filler material for the organic electroluminescent element described in any one of the above items [1] to [9], wherein the resin composition contains inorganic particles having a mean particle diameter of 10 to 60 nm in 1 mass % or more and 20 mass % or less.

[11] The filler material for the organic electroluminescent element described in any one of the above items [1] to [10], wherein a fractal dimension of a contour line of a projected image per one particle of the inorganic particles is larger than 1.

[12] The filler material for the organic electroluminescent element described in any one of the above items [1] to [11], wherein the resin composition contains alkyl ester of a hydrogenated product of organic acid derived from a pine resin fraction.

[13] A method of sealing an organic electroluminescent element, including at least a step of filling the filler material for the organic electroluminescent element described in any one of the above items [1] to [12] into an airtight vessel in which a light-emitting part covered with an insulating protective layer is sealed.

[14] The method of sealing the organic electroluminescent element described in the above item [13], wherein the insulating protective layer is formed of monolayer structure or multilayer structure including at least one layer of an inorganic thin layer formed of a compound containing at least a silicon atom and a nitrogen atom.

In the present invention, a numerical value range indicated using "to" means a range including the numerical values described before and after "to" as the lower limit and the upper limit.

Advantageous Effects of Invention

The present invention can provide a filler material that protects an OLED element from moisture, has no breakage risk of the OLED element by cure shrinkage, and can be applied and filled without any defect onto a surface formed of an inorganic substance of an insulating protective layer for covering a light-emitting part or the like, and a method of sealing an OLED using the same.

Other and further features and advantages of the invention will appear more fully from the following description, appropriately referring to the accompanying drawings.

MODE FOR CARRYING OUT THE INVENTION

Figure 1:
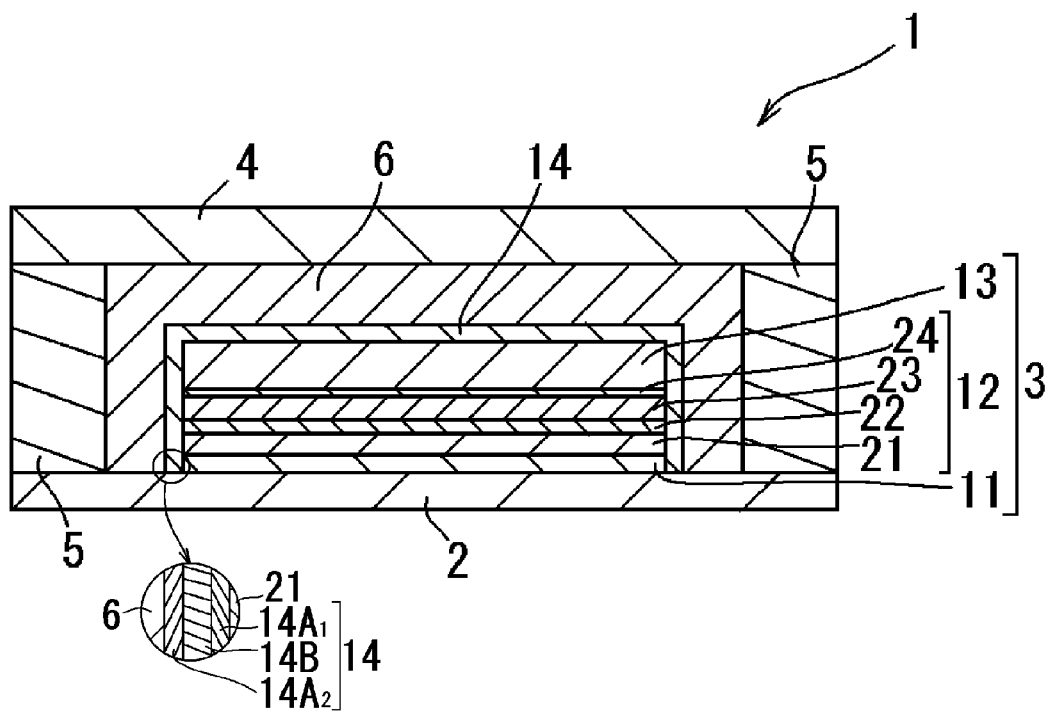
FIG. 1 is a cross-sectional schematic view showing an OLED element using a filler material for an organic electroluminescent element of the present invention.

The preferable embodiment of the present invention is described in detail below.

In addition, the present invention is not limited by this embodiment, and all of other enable embodiments, examples, operation technologies and so forth that are made by those skilled in the art or the like based on this embodiment are contained in the category of the present invention.

Moreover, in the present invention, a petroleum resin means a resin produced by partially polymerizing by-product oil from naphtha cracking performed in a petrochemical industry.

<<Filler Material for an Organic Electroluminescent Element>>

A filler material for an organic electroluminescent element of the present invention (also referred to as a filler material of the present invention) is formed of a resin composition being liquid at 25° C. (hereinafter, 25° C. is also referred to as room temperature), and containing as essential components a hydrocarbon polymer and an organometallic compound described later.

Here, "liquid" means that the resin composition is in the liquid state as a whole, and also includes a case where the composition is a suspension or a dispersion containing a solid dispersed material.

The filler material of the present invention has capability of drying moisture, and is used as a liquid filler material that protects an OLED as described later from the moisture. Thus, the occurrence of a dark-spot in an OLED element can be preferably suppressed by simple work.

The hydrocarbon polymer used in the present invention is a polymer having a number average molecular weight of 300 or more and less than 32,000. Such a hydrocarbon polymer is well compatibilized with an organometallic compound described later to provide the filler material of the present invention with hydrophobicity, and also to provide the filler material of the present invention with flow characteristics and a small contact angle for securing good working efficiency upon application at room temperature to a light-emitting part on which an insulating protective film described later.

The hydrocarbon polymer is the polymer of unsaturated hydrocarbon or the hydrogenated product thereof, and specific examples thereof include a polymer of acyclic unsaturated hydrocarbon or a hydrogenated product thereof, or a polymer of cyclic unsaturated hydrocarbon or a hydrogenated product thereof.

A degree of hydrogenation of the hydrogenated product is not particularly limited, and is defined in terms of an iodine value described later.

In the present invention, the polymer includes a homopolymer and a copolymer.

As the acyclic unsaturated hydrocarbon, an acyclic unsaturated aliphatic hydrocarbon is preferred, and an acyclic olefin is further preferred.

Specific examples of an acyclic polyolefin being a polymer of the acyclic olefin include polyethylene, polypropylene, polyisoprene, polybutadiene, polybutene-1, polyisobutylene, an isoprene-isobutylene copolymer, an isoprene-butadiene copolymer and an ethylene-propylene copolymer. Specific examples of a hydrogenated product of the acyclic polyolefin include hydrogenated polyisoprene, partially hydrogenated polyisoprene, hydrogenated polybutadiene, partially hydrogenated polybutadiene, hydrogenated polybutene-1 and (terminal) hydrogenated polyisobutylene.

In particular, in view of capability of reducing surface energy to provide hydrophobicity and a small contact angle, and also having excellent flowability, polyisobutylene and hydrogenated polyisobutylene are preferred, and polyisobutylene is further preferred.

Specific examples of the cyclic unsaturated hydrocarbon include a cyclic unsaturated aliphatic hydrocarbon and an aromatic hydrocarbon. As the cyclic unsaturated aliphatic hydrocarbon, a cyclic polyolefin is preferred.

The polymer of cyclic unsaturated hydrocarbon or the hydrogenated product thereof is a homopolymer of the cyclic unsaturated hydrocarbon, a copolymer of the cyclic unsaturated hydrocarbon and other copolymerization components, or a hydrogenated product thereof. Specific examples thereof include a styrene-isobutylene copolymer, a styrene-isoprene copolymer, a styrene-butadiene copolymer, a styrene-ethylene-butylene copolymer, a cycloolefin homopolymer, a cycloolefin copolymer and a petroleum resin, or a terpene resin such as polypinene and polylimonene, or a hydrogenated product thereof.

Specific examples of other copolymerization components include the above-described acyclic unsaturated hydrocarbon such as ethylene, propylene, isoprene, isobutylene and butadiene, and also a compound having an ethylenic unsaturated group, such as piperylene, α-methylstyrene, vinyltoluene, indene, cyclopentadiene, cyclopentadiene and dicyclopentadiene.

As the polymer of cyclic unsaturated hydrocarbon or the hydrogenated product thereof, a hydrogenated product of a petroleum resin (called a hydrogenated petroleum resin) is preferred, a hydrogenated product of a copolymerized petroleum resin (called a hydrogenated C5/C9 petroleum resin) between a dicyclopentadiene (DCPD) component containing as a main material a C5 fraction, and an aromatic component being a C9 fraction, a hydrogenated product of a petroleum resin formed of an aromatic component being a C9 fraction (called a hydrogenated C9 petroleum resin), and a hydrogenated product of a terpene resin (called a hydrogenated terpene resin) are further preferred, and a hydrogenated C5/C9 petroleum resin is still further preferred.

As long as the filler material of the present invention is formed into the liquid state, the hydrocarbon polymer can be used alone in one kind or in combination of two or more kinds among the above-described ones.

When the hydrocarbon polymer is used alone in one kind, the polymer of acyclic unsaturated hydrocarbon or the hydrogenated product thereof, being liquid at room temperature, is preferred.

When the hydrocarbon polymer is used in combination of two or more kinds, a combination thereof is not particularly limited. In this case, at least one kind is preferably the polymer of acyclic unsaturated hydrocarbon or the hydrogenated product thereof, or the polymer of cyclic unsaturated hydrocarbon or the hydrogenated product thereof.

In the case where the hydrocarbon polymer is solid at room temperature, such a polymer is preferably dissolved or dispersed into other liquid materials to be used in combination therewith to be liquid at room temperature in the form of a mixture. Such a hydrocarbon polymer being solid at room temperature is further preferably used in combination with the polymer of acyclic unsaturated hydrocarbon or the hydrogenated product thereof, being liquid at room temperature.

In the polymer of cyclic unsaturated hydrocarbon or the hydrogenated product thereof, such as a cycloolefin homopolymer, a cycloolefin copolymer and a hydrogenated petroleum resin, some are solid at room temperature by itself even when the molecular weight is particularly small. Accordingly, in the case where those polymer or the hydrogenated product thereof is solid at room temperature, as described above, such a polymer or a hydrogenated product thereof is preferably used in combination with the polymer of the liquid acyclic unsaturated hydrocarbon or the a hydrogenated product thereof, being liquid at room temperature. Thus, a fluid can be obtained, in which the fluid has significantly reduced moisture permeability to be excellent in moisture-proofing, and has reduced surface energy to have a small contact angle, and has non-Newtonian flow characteristics.

In the case where the polymer of cyclic unsaturated hydrocarbon is used in combination with the polymer of acyclic unsaturated hydrocarbon, a combination of polyisobutylene with the hydrogenated petroleum resin is preferred.

In the present invention, as a polymer component in the resin composition, only the hydrocarbon polymer is preferably contained, more specifically, no resin excluding the hydrocarbon polymer is preferably contained.

The hydrocarbon polymer is preferably at least one selected from the group consisting of polyethylene, polypropylene, polyisoprene, polybutadiene, polybutene-1, polyisobutylene, an isoprene-isobutylene copolymer, an isoprene-butadiene copolymer, an ethylene-propylene copolymer, hydrogenated polyisoprene, hydrogenated polybutadiene, partially hydrogenated polybutadiene, hydrogenated polybutene-1, hydrogenated polyisobutylene, terminal-hydrogenated polyisobutylene, a cycloolefin homopolymer, a cycloolefin copolymer, a terpene resin, a hydrogenated cycloolefin homopolymer, a hydrogenated cycloolefin copolymer, a hydrogenated terpene resin and a hydrogenated product of a copolymerized petroleum resin between a dicyclopentadiene component containing as a main material a C5 fraction and an aromatic component being a C9 fraction.

Moreover, the hydrocarbon polymer preferably contains hydrogenated polyisobutylene, a hydrogenated terpene resin or a hydrogenated product of a copolymerized petroleum resin between a dicyclopentadiene component containing as a main material a C5 fraction, and an aromatic component being a C9 fraction.

In the case where the number average molecular weight is 32,000 or more, the hydrocarbon polymer used in the present invention is unable to provide the filler material of the present invention with flowability, or the like in several cases. From a viewpoint of providing the flowability or the like, the number average molecular weight is preferably 20,000 or less, and further preferably 10,000 or less. On the other hand, in the case where the number average molecular weight is less than 300, such a polymer has a risk of generation of outgassing to cause a break of an OLED in several cases. In view of prevention of generation of outgassing and the break of an OLED, or the like, the number average molecular weight is preferably 400 or more.

The polymer of cyclic unsaturated hydrocarbon or the hydrogenated product thereof having the number average molecular weight less than 1,000 is particularly preferred.

The number average molecular weight is expressed in terms of a value determined as a polystyrene equivalent by Gel Permeation Chromatography (GPC).

In the hydrocarbon polymer used in the present invention, the iodine value is preferably 100 g/100 g or less in view of capability of reducing the moisture permeability, or the like. In particular, in the case where the polymer is used in combination with a specific organometallic compound described later, in view of capability of reducing the moisture permeability to prevent inactivation of the organometallic compound, or the like, the iodine value is preferably 80 g/100 g or less, and further preferably 60 g/100 g or less.

On the other hand, in view of providing the flowability or the like, as the iodine value, a value exceeding 30 g/100 g is preferred, and in the case where the number average molecular weight of the polymer is 20,000 or more, a value of 40 g/100 g or more is further preferred, and a value of 50 g/100 g or more is still further preferred.

The iodine value of the hydrocarbon polymer can be appropriately adjusted depending on a kind, the number average molecular weight and a degree of hydrogenation of unsaturated hydrocarbon.

In addition, the iodine value is expressed in terms the number of grams of iodine ($I_2$) that can be added to 100 g of a substrate, or in this case the hydrocarbon polymer. Specific examples of a method of measuring the iodine value include a titrimetric method utilizing a color reaction such as a Wyss method or a Hanus method.

Specifically, a sample for measurement is accurately weighed, and an organic solvent without causing a reaction with iodine, such as cyclohexane, is added thereto and diluted. Next, a Wyss reagent (acetic acid solution of iodine monochloride) or a Hanus reagent (acetic acid solution of iodine bromide) is added thereto, and the resultant mixture is allowed to stand for about 30 minutes to 1 hour to progress the reaction. Next, an excessive amount of aqueous solution of potassium iodide is added thereto, then unreacted iodine is freed to form a triiodide ion and transfers to an aqueous phase. A trace amount of starch is added thereto to develop an indigo blue color by an iodo-starch reaction, and then an aqueous solution of sodium thiosulfate is slowly added dropwise thereto, and a time point at which the indigo blue color disappears is taken as an equivalence point. From an amount of sodium thiosulfate used before reaching the equivalence point, an amount of iodine not used for the reaction is calculated. In the same manner, a control experiment is conducted in a system having no sample for measurement to determine an amount of iodine originally contained in the Wyss reagent or the Hanus reagent. An amount of iodine used in the reaction is determined from the thus obtained differential between the amounts of iodine depending on existence or non-existence of the sample for measurement, and this amount is converted into a value per 100 g of hydrocarbon polymer, and the converted value is taken as the iodine value.

The hydrocarbon polymer preferably has no polar group at least at a terminal, and further preferably has no polar group. The hydrocarbon polymer having no polar group at least at the terminal has at the terminal a hydrogen atom, or a non-polar group such as an alkyl group including a methyl group and a methylene group, and a cyclic alkyl group including a cyclopentyl group and a cyclohexyl group. Such a non-polar group is a group consisting of the carbon atom and the hydrogen atom as in each group described above to reduce surface energy of the filler material of the present invention and to provide the filler material with a small contact angle. Accordingly, the hydrocarbon polymer containing the non-polar group at a high content is preferred in view of obtaining the filler material of the present invention having the good wettability.

The polar group is a group having polarity stronger than the polarity of the group consisting of the carbon atom and the hydrogen atom, and specific examples thereof include a group containing a hetero atom, and further specific examples thereof include a hydroxyl group, a carboxy group, an alkoxycarbonyl group, an aryloxycarbonyl group, an acyloxy group and a group having a cyclic ether skeleton.

In view of keeping the good wettability (related also to the flowability) onto the insulating protective layer and preventing the moisture permeability, a ratio (content) of the hydrocarbon polymer in the filler material of the present invention as a whole is preferably 50 to 90 mass %, and further preferably 60 to 80 mass %.

In the case where the filler material contains the polymer of cyclic unsaturated hydrocarbon or the hydrogenated product thereof, a content thereof in the filler material of the present invention is preferably 50 or less mass %.

In the case where two or more kinds of the hydrocarbon polymers are combined and used, as long as the filler material of the present invention is formed into the liquid state, a content of each hydrocarbon polymer is appropriately set within the above-described range, and is not particularly limited.

In the case where the polymer of acyclic unsaturated hydrocarbon and the polymer of cyclic unsaturated hydrocarbon, particularly the hydrogenated petroleum resin are combined and used, a higher content of the polymer of acyclic unsaturated hydrocarbon such as polyisobutylene in comparison with the content of the polymer of cyclic unsaturated hydrocarbon such as cyclic polyolefin is further preferred in view of the flowability.

The organometallic compound used in the present invention functions as a drying component in the filler material of the present invention. More specifically, this organometallic compound scavenges the moisture invaded from outside to enable the occurrence of a dark-spot to be suppressed.

The organometallic compound is a compound that can scavenge the moisture, and a compound or a complex represented by Formula 1. The organometallic compound has an ion of a central metal M and the same organic group L formed of atoms having 9 or more carbon atoms and 1 or more oxygen atoms.

$$M\text{-}L_n \qquad \text{Formula (1)}$$

In Formula (1), M represents a metal atom. L represents an organic group having 9 or more carbon atoms and 1 or more oxygen atoms, and all of L represent the same organic group. n represents the valence of a metal atom M.

A central metal atom M is preferably an atom of a metal element belonging to any one of group 2 to group 4 and group 11 to group 14 in the long periodic table of elements from a viewpoint of transparency. Specifically, calcium, titanium, zinc, aluminum, silicon, magnesium or barium is preferred, and above all, aluminum or calcium is further preferred, and aluminum is particularly preferred from a viewpoint of capability of satisfying both the drying capability and the wettability. Moreover, from aluminum or the like, a transparent and colorless filler material can also be obtained, and such a material can also be applied to the top emission type device.

The organic group L is a ligand or an anion that chemically bonds with the metal atom M to form a complex or a compound, and is derived from an organic molecule having 9 or more carbon atoms and 1 or more oxygen atoms.

In the case where the number of carbon atoms in the organic group L is 9 or more, the moisture permeability can be suppressed, and particularly in the case where the organic group L has cyclic saturated hydrocarbon structure, such a case is better. Moreover, in the case where the number of oxygen atoms is 1 or more, the organic group L chemically bonds with the metal atom M, and thus obtained organometallic compound well scavenges the moisture invading into the system.

In the organic group L, from viewpoints of reducing the surface energy to improve the wettability, a group having 10 or more carbon atoms in a total and 1 or more oxygen atoms in one molecule is preferred, and a group having 10 or more carbon atoms and 4 or less oxygen atoms is further preferred. On the other hand, in the case where the number of carbon atoms exceeds 18, the compound is easily crystallized to produce a problem such as lack in the flowability and cloudiness, and therefore the number of carbon atoms is most preferably in the range of 10 to 18. Moreover, in the case where the number of oxygen atoms exceeds 4, hydrophilicity becomes excessive, and the moisture is easily permeated, on the contrary. Therefore, the range from 1 to 4 is preferred.

From viewpoints of mutual solubility with the hydrocarbon polymer and the wettability, such an organic group L is preferably a group derived from aliphatic alcohol, polyol, β-diketone, β-ketoester, malonic ester or the like. Among them, a group derived from aliphatic alcohol, β-diketone, or β-ketoester is further preferably.

All of the organic groups L in one molecule of the organometallic compound are the same. In the case where all of the organic groups L are the same and the number of carbon atoms is 9 or more, compatibility with the hydrocarbon polymer becomes satisfactory. In particular, when the hydrocarbon polymer contains the cyclic unsaturated aliphatic hydrocarbon, compatibility with the cyclic unsaturated aliphatic hydrocarbon becomes satisfactory. As a result, the filler having excellent transparency can be obtained, and therefore aesthetic appearance upon application to an OLED device is excellent.

Moreover, all of the organic groups L are preferably the above-described preferred ones. For example, a case where all of the organic groups L are a ligand or an anion having 9 to 18 carbon atoms and 1 to 4 oxygen atoms is excellent in view of a good balance regarding performance, and preferred.

In addition, the organometallic compound having, as the ligand or the anion, the organic group having 3 or less carbon atoms (including a case of 0 carbon atoms) increases the surface energy to increase the contact angle in several cases. Accordingly, from a viewpoint of the wettability, no addition of the organometallic compound containing the organic molecule having 3 or less carbon atoms to the filler material is preferred.

Then, n represents a valence of the metal atom M, and n is 3 for aluminum, and n is 2 for calcium.

The organometallic compound used in the present invention is preferably represented by Formulas (2) to (5).

$$M(OR^1)_{n1} \quad \text{Formula (2)}$$

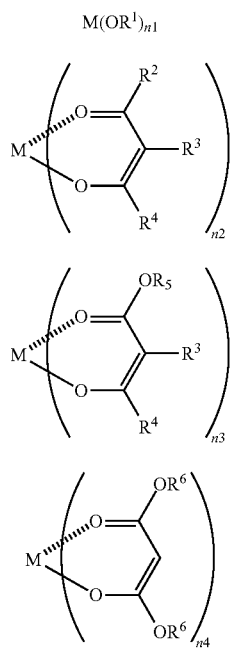

Formula (3)

Formula (4)

Formula (5)

In Formulas (2) to (5), M represents a metal atom, and has the same meaning as M in Formula (1). The metal atom M described above is preferably aluminum or calcium.

n1 to n4 each independently represents a valence of the metal atom M, and have the same meaning as n in Formula (1).

The organometallic compound represented by Formula (2) is a metal compound having a residue of aliphatic alcohol as the organic-group L, and preferably aliphatic monoalcohol. Accordingly, in Formula (2), $R^1$ preferably represents an alkyl group, an alkenyl group or an alkynyl group.

The alkyl group, the alkenyl group and the alkynyl group have 9 or more carbon atoms, and preferably 10 to 18 carbon atoms, and may be a linear chain, a branched chain or cyclic, and preferably a branched chain.

Specific examples of such an alkyl group include a linear-chain, branched-chain or cyclic nonyl group, decyl group, dodecyl group, tetradecyl group, hexadecyl group or stearyl group.

Specific examples of the alkenyl group and the alkynyl group include a myristoleyl group and a palmitoleyl group.

The above-described aliphatic monoalcohol is not particularly limited. Specific examples include normal nonyl alcohol, isononyl alcohol, decyl alcohol, isodecyl alcohol, normal dodecyl alcohol, stearyl alcohol, isostearyl alcohol and isomyristyl alcohol.

The organometallic compound represented by Formula (3) is a metal complex having a residue of β-diketone as the organic-group L.

In Formula (3), $R^2$ and $R^4$ each independently represent an alkyl group, an alkenyl group, an alkynyl group, an aralkyl group or an aryl group, and an alkyl group is preferred. $R^3$ represents a hydrogen atom, an alkyl group, an alkenyl group, an alkynyl group, an aralkyl group or an aryl group, and a hydrogen atom is preferred.

The number of carbon atoms of $R^2$ and $R^4$ each is at least 1 or more, and the total number of carbon atoms constituting $R^2$ to $R^4$ is 6 or more, and preferably 7 to 15.

The alkyl group, the alkenyl group and the alkynyl group may be a linear chain, a branched chain or cyclic, and preferably a linear chain. Specific examples of the alkyl group include a methyl group, an ethyl group, and a liner-chain, branched-chain or cyclic propyl group, butyl group, hexyl group, octyl group, nonyl group, decyl group, tetradecyl group or cyclohexyl group. Specific examples of the alkenyl group and the alkynyl group include a myristoleyl group and a palmitoleyl group.

Specific examples of the aralkyl group include a benzyl group and a phenethyl group.

Specific examples of the aryl group include a phenyl group, a tolyl group and a dimethyiphenyl group.

Moreover, β-diketone is not particularly limited. Specific examples thereof include 4,6-nonanedione, 4,6-decanedione, 5,8-dodecanedione, 1,2-cyclododecanedione and 2,2-dimethyl-6-ethyl-3,5-decanedione.

The organometallic compound represented by Formula (4) is a metal complex having a residue of β-ketoester as the organic-group L.

In Formula (4), $R^4$ and $R^5$ each independently have the same meaning as $R^4$ and $R^2$ in Formula (3), and preferred ones are also the same. $R^3$ has the same meaning as $R^3$ in Formula (3), and preferred ones are also the same.

Then, β-ketoester is not particularly limited. Specific examples thereof include pentyl acetoacetate, neopentyl acetoacetate, hexyl acetoacetate, 2-ethylhexyl acetoacetate, butylisobutyroyl acetate, methyl caproylacetate and methyl lauroylacetate.

The organometallic compound represented by Formula (5) is a metal complex having a residue of malonic diester as the organic group L.

In Formula (5), $R^6$ represents an alkyl group, an alkenyl group, an alkynyl group, an aralkyl group or an aryl group, and an alkyl group is preferred. The number of carbon atoms of $R^6$ each is at least 1 or more, and the total number of carbon atoms constituting two of $R^6$ is 6 or more, and preferably 7 to 15. Two of $R^6$ may be the same as or different from each other, and preferably the same as each other. The alkyl group, the alkenyl group, the alkynyl group, the aralkyl group or the aryl group described above is the same as the alkyl group, the alkenyl group, the alkynyl group, the aralkyl group or the aryl group of $R^2$ and $R^4$ in Formula (3) except that the number of carbon atoms is different therefrom.

Malonic diester is not particularly limited. Specific examples thereof include dipropyl malonate, diisopropyl malonate, dibutyl malonate and di-tertiary butyl malonate.

In view of the contact angle and the flowability, a content of the organometallic compound in the filler material of the present invention is preferably 5 to 40 mass %, and further preferably 10 to 30 mass %.

The resin composition preferably contains the inorganic particles. Thus, the composition can provide the filler material of the present invention with a non-Newtonian property, particularly thixotropy.

The inorganic particles are not particularly limited, as long as the particles are particles of the inorganic compound. Specific examples thereof include silica, alumina, smectite, talc, mica, titania and zeolite. Above all, silica, smectite or talc is preferred.

The inorganic particles used in the present invention preferably have a shape further complicated than a spherical shape or a square shape. Accordingly as the shape of the inorganic particles is further complicated, an effect of providing the filler material with the thixotropy based on an amount of addition is increased.

When complexity of the shape of the inorganic particles is evaluated from a projected image per one piece of the inorganic particles, for example, the complexity can be evaluated based on a fractal dimension of a contour line of the projected image drawn on a plane. The fractal dimension can be calculated, based on an image obtained by a scanning electron microscope (SEM), an atomic force microscope (AFM) or a transmission electron microscope (TEM), by applying a box counting method or the like. When the fractal dimension is calculated on a line or a diagram on the plane exemplified in the contour line as described above, the fractal dimension takes a value of 1.0 to 2.0. A detailed method of calculating the fractal dimension is described later.

In the present invention, from a viewpoint of thixotropy, the fractal dimension of the inorganic particles is preferably 1 or more, further preferably 1.1 or more, and still further preferably 1.3 or more. An upper limit is not particularly limited, but is realistically less than 2.0 as described above.

The particles having the fractal dimension in the above-described range and having a complicated particle shape can be found from kinds of fumed silica forming a mass in which silica particles of several nanometers are strongly bonded with each other by a Si-O covalent bond.

In the inorganic particles, from a viewpoint of the transparency, a mean particle diameter is preferably 60 nm or less, and further preferably 50 nm or less. On the other hand, from a viewpoint of providing the filler material with the thixotropy, the mean particle diameter is preferably 10 nm or more, and further preferably 30 nm or more. The mean particle diameter means a mean particle diameter of primary particles. For example, the primary particles having 60 nm or less and a complicated shape may be prepared by fusing a plurality of particles having the mean particle diameter of several nanometers or less at a high temperature to bond the particles with each other by a covalent bond. One in which the primary particles are bonded with each other by van der Waals force or interaction other than the covalent bond, such as a hydrogen bond, is distinguished as a secondary aggregate from the above-described primary particles. Such a secondary aggregate is brittle and unstable, and therefore even if the fractal dimension of the secondary aggregate is supposedly large, the effect described above is hard to be expected.

Here, the mean particle diameter means a mean of the particle diameter per the number of the particles, as measured by a laser diffraction method specified in JIS Z 8825-1, for one group of particle population.

Various kinds of measuring apparatuses are available in which the laser diffraction method described above can be executed, but LA-960 Series of HORIBA, Ltd., IG-1000 Series of Shimadzu Corporation or the like is preferred.

In order to improve dispersibility, the inorganic particles may be subjected to oleophilic surface treatment. For example, the inorganic particles may be subjected to surface treatment by a silane coupling agent having an alkyl group, long-chain carboxylic acid and a salt thereof, long-chain thiol or alkylamine. If the inorganic particles are subjected to the surface treatment as described above, the dispersibility is improved.

In addition, in the case where smectite subjected to the oleophilic surface treatment is used as the inorganic particles, attention is required for coloring (degree of transparency) during use in combination with the cyclic polyolefin or the hydrogenated product thereof, particularly the hydrogenated petroleum resin. For example, in the case where the dispersibility of the smectite is poor, the degree of transparency is reduced in several cases, and therefore the dispersibility is preferably improved by alkyl ester of a hydrogenated product of organic acid derived from a pine resin fraction as described later, or the like.

A content of the inorganic particles in the filler material of the present invention is preferably 0 to 20 mass %, and from a viewpoint of providing the filler material with the thixotropy, further preferably 0.5 to 20 mass %, and still further preferably 1 to 20 mass %, particularly preferable 1 to 10 mass %.

The inorganic particles can be used alone in one kind, or in combination of two or more kinds.

The resin composition preferably contains alkyl ester of the hydrogenated product of organic acid derived from the pine resin fraction. Thus, compatibility between the hydrocarbon polymer and the organometallic compound can be improved. Moreover, In the case where the filler material contains the inorganic particles, the dispersibility of the inorganic particles can also be improved.

The organic acid derived from the pine resin fraction only needs to be organic acid obtained by distilling a pine resin being sap of a plant in the Pinaceae. Specific examples thereof include rosin acid and various kinds of acid forming the rosin acid. Specific examples of the acid forming the rosin acid include abietic acid, neoabietic acid, palustric acid, pimaric acid, isopimaric acid and dehydroabietic acid. Above all, abietic acid or neoabietic acid is preferred.

Alcohol for alkyl-esterifying the hydrogenated product of organic acid derived from the pine resin fraction is not particularly limited. Aliphatic alcohol is preferred and aliphatic polyhydric alcohol is also preferred. Specific examples of the aliphatic polyhydric alcohol include glycerol, ethylene glycol and propylene glycol.

Specific examples of the alkyl ester of the hydrogenated product of organic acid derived from the pine resin fraction include tri(tetrahydroabietic acid)glyceryl and tri(tetrahydroneoabietic acid)glyceryl.

A content of the alkyl ester of the hydrogenated product of organic acid derived from the pine resin fraction in the filler material of the present invention is preferably 0 to 20 mass %, and in view of improving dispersibility of a thixotropy-imparting agent, further preferably 0.5 to 20 mass %, and still further preferably 1 to 10 mass %.

These can be used alone in one kind, or in combination of two or more kinds.

The resin composition may contain a resin other than the hydrocarbon polymer, a plasticizer, a silane coupling agent, a preservation stabilizer, an antioxidant, an ultraviolet light absorber, a tackiness adjuster, a resin stabilizer, a solvent or the like.

In addition, the resin other than the above-described hydrocarbon polymer is different from the hydrocarbon polymer having the number average molecular weight of 300 or more and less than 20,000 and the iodine value less than 40 g/100 g, and having no polar group according to the present invention.

<Characteristics of Filler Material for Organic Electroluminescent Element>

The filler material formed of the above-described resin composition of the present invention has or preferably has characteristics described below.

(Contact Angle to Silicon Nitride)

In the filler material of the present invention, the contact angle to silicon nitride is 10 to 40 degrees. In the case where this contact angle is 40 degrees or less, upon application onto the insulating protective layer provided on the OLED layer or the light-emitting part or the like and containing silicon nitride or an inorganic substance similar thereto, the filler material of the present invention naturally spreads on a surface of the insulating protective layer, and can be applied without a defect such as cissing. On the other hand, in the case where the contact angle is less than 10 degrees, the filler material excessively spreads and flows over a dam material to have a risk of contaminating an external surface of an OLED substrate or the like.

The contact angle can be adjusted depending on a kind of hydrocarbon polymer (a kind of unsaturated hydrocarbon, the number average molecular weight, the iodine value and existence or non-existence of the polar group), and structure and an content the organometallic complex. A method of measuring the contact angle is specifically described in Examples.

(Amount of Outgassing)

In the filler material of the present invention, an amount of outgassing other than the moisture upon being heated at 85° C. for 1 hour is 500 ppm or less in terms of the toluene equivalent. In the case where this amount of outgassing exceeds 500 ppm, even if applicability of the filler material of the present invention is satisfactory, gas bubbles derived from outgassing are generated to cause a gas bubble-like defect. Thus, visibility of an OLED is reduced. This regard becomes significant when the OLED is placed under warm conditions for a long period of time. The amount of outgassing is preferably 200 ppm or less, and further preferably 100 ppm in view of prevention of the gas bubble-like defect, and the visibility. In addition, the amount of outgassing is ideally 0 ppm, but realistically is not decreased to 0 ppm, and is about 10 ppm, for example.

This amount of outgassing only needs to be within the above-described range at least during use (during application).

The gas generated under the above-described conditions is water (water vapor), the low molecular weight component of the hydrocarbon polymer, the solvent or the like. The gas other than the moisture is not scavenged with the organometallic compound.

In order to reduce the amount of outgassing within the above-described range, the following means can be applied. Specific examples include a method of reduction of a residual amount of the solvent to be used, when necessary upon preparing the filler material of the present invention, and a method of removing the low molecular weight component after the above-described components are mixed. Specific examples of these methods include heat treatment, decompression treatment or heating decompression treatment. Conditions of heating and decompression are appropriately set up depending on the solvent and the component to be used, for example.

Heating decompression treatment is preferably applied, and is further preferably applied, for example under reduced pressure, at 60 to 90° C. for 30 minutes to 3 hours.

In addition, if the amount of outgassing is within the above-described range, no application of a means for further reducing the amount may be needed.

A method of measuring the amount of outgassing is specifically described in Examples.

(Viscosity)

The filler material of the present invention is preferably a non-Newtonian fluid having a non-Newtonian property at 25° C. and at a shear rate in a region of 0.1 to 1000 $S^{-1}$. Here, the temperature of 25° C. is provided in assuming typical temperature during application of the filler material of the present invention. In a similar manner, the shear rate of 0.1 to 1000 $S^{-1}$ is provided in assuming a rate of shear acting on the filler material at a high velocity in a step of application of the filler material of the present invention. For example, the shear rate of 1000 $S^{-1}$ is provided in assuming a dynamic state upon application by using a dispenser or the like in the step of application of the filler material of the present invention. Moreover, the shear rate of 0.1 $S^{-1}$ is provided in assuming a static state during the time of no application work between intervals of application for every device upon application to a plurality of devices, or upon an already filled device being conveyed to the following counter substrate lamination step.

In the dynamic state, the filler material preferably has low viscosity from a viewpoint of spread, and in the static state, the filler material preferably has high viscosity from a viewpoint of suppressing leak and oozing. Accordingly, in the case where the filler material is the non-Newtonian fluid, particularly a thixotropic fluid within the above-described region, the working efficiency during application is further improved, and the filler material can be applied thereto without generating almost all of the gas bubble-like defects.

The non-Newtonian property means a property of viscosity in which a relationship between shear stress of flow and a velocity gradient of the flow is non-linear, and a fluid having this property is called the non-Newtonian fluid. The non-Newtonian fluid is generally classified into a Bingham fluid, a thixotropic fluid, a pseudoplastic fluid and a dilatant fluid. In the present invention, the filler material is preferably a thixotropic fluid or a pseudoplastic fluid, and in particular, a thixotropic fluid is preferred. This thixotropic fluid is a fluid that further easily flows accordingly as the flow becomes stronger and flowing time becomes longer, and a fluid the viscosity of which is reduced upon shear force being applied thereto.

In order to form the filler material of the invention into the non-Newtonian fluid, and preferably the thixotropic fluid, specific examples thereof include a method of selecting a kind (the number average molecular weight, the iodine value and existence or non-existence of the polar group) of the hydrocarbon polymer, and a method of using the inorganic particles, and preferably a method of using the inorganic particles together with the alkyl ester of the hydrogenated product of organic acid derived from the pine resin fraction. In addition thereto, specific examples thereof include a method of mixing poorly compatible materials with each other and then emulsifying the resultant mixture.

Evaluation of viscosity of the filler material of the present invention is specifically described in Examples.

(Total Luminous Transmittance)

The filler material of the present invention is preferably transparent in a visible region (350 nm to 800 nm), and at least, total luminous transmittance in a wavelength region of 350 to 800 nm is preferably 90% or more at a path length of 25 μm. In the case where this total luminous transmittance is 90% or more, light can be emitted to an outside of an OLED element without intercepting almost all of light emitted from the OLED element, and such a material is preferred particularly as the filler material for the top emission type OLED. This total luminous transmittance is preferably 95% or more, and further preferably 97% or more.

The total luminous transmittance varies depending on a kind, a content or the like of the organometallic compound and the inorganic particles in several cases, and therefore can be adjusted by appropriately selecting such a material, or a kind, a content or the like of the hydrocarbon polymer.

(Total Luminous Transmittance after Moisture Absorption)

In the filler material of the present invention, total luminous transmittance in a wavelength region of 350 to 800 nm after storage at 60° C. for 100 hours under an environment of 90% RH (also referred to as the total luminous transmittance after moisture absorption) is preferably 80% or more at a path length of 25 µm. In the case where the total luminous transmittance after moisture absorption is 80% or more, even if an OLED element is placed under a high temperature and high humidity environment, light can be emitted to an outside of the OLED element without significantly intercepting light emitted from the OLED element, and such a material is preferred particularly as the filler material for the top emission type OLED. The total luminous transmittance after moisture absorption is preferably 90% or more, and further preferably 95% or more. An upper limit of the total luminous transmittance after moisture absorption is realistically about 94%.

A method of measuring the total luminous transmittance after moisture absorption is specifically described in Examples.

The filler material of the present invention can be prepared in the form of the resin composition by, when necessary dissolving or dispersing each component described above into a solvent, and mixing these components. On the above occasion, mixing conditions such as a mixing method and a mixing order, and environment conditions such as temperature, humidity and pressure, and so forth are not particularly limited.

In addition, when the solvent is used, after being mixed, the solvent is removed to be within the above-described amount of outgassing or less.

<<OLED Element>>

The filler material of the present invention is applied as part of structure of sealing an OLED.

An OLED element to which the filler material of the present invention is applied is described below.

The OLED element is provided with a pair of counter electrodes, namely an anode and a cathode, a light-emitting part arranged between the electrodes and having an OLED layer, and the filler material of the present invention to be filled inside the OLED element.

The OLED layer only needs to have at least a light-emitting layer, and may have monolayer structure of the light-emitting layer only. Moreover, for example, the OLED layer may have multilayer structure such as light-emitting layer/electron transport layer, hole transport layer/light-emitting layer, hole transport layer/light-emitting layer/electron transport layer, light-emitting layer/electron transport layer/electron injection layer, hole injection layer/hole transport layer/light-emitting layer/electron transport layer, and hole injection layer/hole transport layer/light-emitting layer/electron transport layer/electron injection layer.

The OLED layer is ordinarily provided on an element substrate having an insulation property and formed of a rectangular glass plate, for example.

The light-emitting part formed of two electrodes and the OLED layer arranged between the electrodes may be, for example, in a case where the number of the OLED layer is 1, or two or more OLED layers are combined and assembled, and can have various layer configurations.

One example of the OLED element is described, referring to FIG. 1.

The OLED element 1 is provided with an element substrate 2, a light-emitting part 3 provided on the element substrate 2, a counter substrate 4 facing with the element substrate 2, a dam material 5 surrounding a periphery of the light-emitting part 3, and a filler material 6 of the present invention (also simply referred to as the filler material) 6 filled, in a non-gas bubble state, into a space hermetically closed by these components.

The light-emitting part 3 has an anode 11 and a cathode 13, and an OLED layer 12 arranged between the electrodes, as described later. On a surface of the light-emitting part 3, an insulating protective layer 14 is provided.

Thus, the light-emitting part 3 is contained in the space hermetically closed with the element substrate 2, the counter substrate 4 and the dam material 5, and sealed with the filler material 6.

The element substrate 2 is formed of a hard material, for example, an inorganic material such as yttrium stabilized zirconia (YSZ), glass and metal, or a resin material such as polyester, polyimide and polycarbonate. The substrate has no restriction on a shape, structure, a dimension thereof or the like, and an optimum substrate can be selected according to a configuration of an objective OLED element. A general element substrate 2 has a plate shape. Moreover, the element substrate 2 may be transparent and colorless, or translucent or opaque. Moreover, on the element substrate 2, a moisture permeation prevention layer (gas barrier layer) or the like may be provided, or a driving circuit formed of TFT or the like may be provided thereon, when necessary.

On the element substrate 2, the light-emitting part 3 is formed.

Specifically, on the element substrate 2, the anode 11 formed of a thin film of an electrically conductive material such an indium tin oxide (ITO) film is formed. The ITO film can be formed, for example by a PVD (physical vapor deposition) method such as a vacuum deposition method and a sputtering method. Then, the film is subjected to patterning into a predetermined pattern shape by etching or the like by a means of a photoresist method, and thus formed. Part of the anode 11 is drawn to an end portion of the element substrate 2, and connected to the driving circuit.

Specific examples of the electrically conductive material include ITO, and also semi-conductive metal oxide such as tin oxide, zinc oxide and indium oxide, metal such as gold, silver, chromium and nickel and an organic electrically conductive material such as polyaniline and polythiophene.

On an upper surface of the anode 11, the OLED layer 12 formed of a thin film of an organic compound material is laminated by a PVD method such as a vacuum deposition method and a resistance heating method. The OLED layer 12 is formed in the form of four-layered structure including a hole injection layer 21 a film of which is formed on the anode 11, a hole transport layer 22 a film of which is formed on an upper surface of the hole injection layer 21, a light-emitting layer 23 a film of which is formed on an upper surface of the hole transport layer 22 and an electron transport layer 24 a film of which is formed on an upper surface of the light-emitting layer 23.

The hole injection layer 21 and the hole transport layer 22 can be formed of a hole transport material, respectively. The hole transport material has any one of a function of injecting a hole (positive hole) from the anode 11, a function of transporting the hole or a function of barriering an electron injected from the cathode 13. Specific examples of the hole transport material include copper phthalocyanine (CuPc), bis[N-(1-naphthyl)-N-phenyl]benzidine (α-NPD), N,N'-diphenyl-N,N'-di(m-tolyl)benzidine, N,N,N',N'-tetrakis(m-tolyl)-1,3-phenylenediamine, 1,1-bis[4-[N,N-di(p-tolyl)amino]phenyl]cyclohexane and 4,4',4"-tris[N,N',N"-triphenyl-N,N',N"-tri(m-tolyl)amino-phenylene.

A thickness thereof is not particularly limited, but is ordinarily 5 to 100 nm, and preferably several tens of nanometers.

The light-emitting layer 23 includes at least one kind of light-emitting material, and may include a hole transport material, an electron transport material or the like, when necessary. The light-emitting material is not particularly limited.

Specific examples of the light-emitting material include a metal complex, a low molecular weight fluorescent dye or a fluorescent polymer compound.

Specific examples of the metal complex include a tris(8-quinolinolato)aluminum complex (Alq3), a bis(benzoquinolinolato)beryllium complex, a bis(8-quinolinolato)zinc complex and a phenanthroline-based europium complex. Specific examples of the low molecular weight fluorescent dye include perylene, quinacridone, coumarin and 2-thiophene carboxylic acid. Specific examples of the fluorescent polymer compound include poly(p-phenylenevinylene), 9-chloromethyl anthracene, polyfluorene and polyvinylcarbazole.

A thickness of the light-emitting layer 23 is not particularly limited, but is ordinarily 5 to 100 nm, and preferably several tens of nanometers.

The electron transport layer 24 can be formed of an electron transport material. The electron transport material has either a function of transporting an electron or a function of barriering a hole injected from the anode 11. Specific examples of the electron transport material include lithium fluoride (LiF), 2-(4-tert-butylphenyl)-5-(4-biphenyl)-1,3,4-oxadiazole and 3-(4-tert-butylphenyl)-4-phenyl-5-(4-biphenyl)-1,2,4-triazole.

A thickness of the electron transport layer 24 is not particularly limited, but is ordinarily 5 to 100 nm, and preferably several tens of nanometers.

The cathode 13 is formed on an upper surface of the electron transport layer 24 of the OLED layer 12 in the form of a thin film of the electrically conductive material. Specific examples of a material of a metal thin film include a metal of Al, Li, Mg and In. Part of the cathode 13 is drawn to the end portion of the element substrate 2, and connected to the driving circuit.

The anode 11, the OLED layer 12 and the cathode 13 are covered with the insulating protective layer 14 for protecting them from moisture and oxygen. The insulating protective layer 14 has an inorganic thin layer formed of an insulating inorganic substance. The insulating inorganic substance is not particularly limited. Specific examples thereof include a compound containing at least a silicon atom and a nitrogen atom, metal nitride and metal oxide. A compound containing at least a silicon atom and a nitrogen atom is preferred, and silicon nitride or silicon oxynitride is preferred in view of an excellent balance between moisture-proofing and transparency.

The inorganic thin layer can be provided by a method selected from a plasma CVD, ion-beam-assisted vapor-deposition or reactive sputtering method or the like.

The insulating protective layer 14 has at least one layer of the inorganic thin layer, and may have monolayer structure including one layer of the inorganic thin layer or multilayer structure including at least two layers of the inorganic thin layers.

In the case where the layer has the multilayer structure, a flattening layer 14B is preferably provided between two adjacent layers, namely an inorganic thin layer $14A_X$ and an inorganic thin layer $14A_{X+1}$ in view of reducing an adverse influence of the moisture permeation through a microscopic defect generated inside the inorganic thin layer. The flattening layer 14B is formed of an inorganic substance or an organic substance having an insulation property, and a film thereof can be formed by a method selected from various kinds of vapor deposition methods, a spin coating method, a spray method or the like. A material used for this flattening layer 14B only needs to be a substance different from the substance of the inorganic thin layer. As the inorganic substance, silicon oxide, silicon carbide oxide, aluminum oxide or the like can be preferably used, and as the organic substance, a fluorocarbon resin, an acrylic resin, polyimide or the like can be preferably used.

Lamination structure between the inorganic thin layer $14A_X$ and the flattening layer 14B can further suppress an adverse influence due to the microscopic defect to improve a barrier property against moisture or oxygen, accordingly as the number of layers of the multilayer increases. However, as the structure adaptable to a product for general use, three-layered structure of inorganic thin layer $14A_1$/flattening layer 14B/inorganic thin layer $14A_2$ is realistic in view of cost.

Thus, a laminate is formed of the light-emitting part 3 including lamination structure of the anode 11, the OLED layer 12 and the cathode 13, and the insulating protective layer 14.

An airtight vessel in the form of containing the laminate is formed on the element substrate 2 by the element substrate 2 on which the light-emitting part 3 covered with the insulating protective layer 14 is mounted, and for example a rectangular counter substrate 4 and the dam material 5.

As a material of the counter substrate 4, a material selected from metal, glass, a film formed of a polymer, or the like can be used. Above all, in the case where the material is a transparent and colorless material such as glass, PET, PEN and aliphatic polyimide, the top emission type in which light is emitted from an upper surface of the OLED element 1 through the counter substrate 4 can be adopted, for example. In a case of the top emission type, a color filter may be laminated onto the counter substrate 4. On the counter substrate 4, an inorganic layer formed of silicon nitride or the like may be provided by a method such as vapor deposition in order to suppress permeation of moisture or oxygen.

The dam material 5 is not particularly limited, but can be formed by a method of applying onto both substrates 2 and 4 an adhesive formed of a mixture of inorganic particles and a thermosetting resin or a photosetting resin such as an epoxy resin and an acrylic resin, or the like by a dispenser so as to surround a periphery of the substrate, and curing the applied material. Alternatively, the dam material 5 can be formed by applying a method of performing laser welding of a window frame-shaped glass onto both of the substrates 2 and 4. The thus formed dam material 5 has a role of preventing the counter substrate 4 from being brought into contact with the light-emitting part 3, and simultaneously containing the light-emitting part 3 to keep airtightness of the airtight vessel, and preventing a liquid filler 6 described later from being leaked to an outside.

An inside of the thus formed airtight vessel is filled with the filler material 6 of the present invention.

The OLED element having the filler material of the present invention is produced by sealing the light-emitting part by a sealing method of the present invention. Accordingly, the sealing method of the present invention also serves as a method of producing the OLED element.

The sealing method and the method of producing the OLED element including this method according to the present invention are specifically described. In addition, the following description does not limit the present invention, and all of arts of performing design changes in light of the spirit of the present invention are included in the technical scope of the present invention.

The sealing method of the present invention at least has a step of filling the filler material for the organic electroluminescent element of the present invention into the airtight vessel in which the light-emitting part covered with the insulating protective layer is sealed and surrounded.

In the sealing method of the present invention, the laminate including the airtight vessel formed of the element substrate, the counter substrate and the dam material, and the light-emitting part 3 can be provided as described above.

In the sealing method of the present invention, before the counter substrate is adhered onto the dam material, the filler material of the present invention is filled onto the laminate or into a space between the laminate and the dam material.

The filler material of the present invention is preferably filled at room temperature and under an atmosphere of an inert gas such as a nitrogen gas in order to prevent moisture from being mixed.

An amount of application ordinarily corresponds to capacity equal to a space volume inside the airtight vessel, or an amount slightly larger than the capacity.

A liquid material of the present invention is filled by being applied by a dispenser, a slit die, screen printing or the like, and a dispenser is particularly excellent in view of capability of applying the material to the device having various sizes or shapes without particularly changing specifications of a machine, a tool or the like. Upon applying the material by the dispenser or the like, viscosity of the filler material of the present invention is preferably as small as possible in view of ease of extruding the material from the syringe, and is further preferably less than 1,000 Pa·sec, and still further preferably less than 100 Pa·sec. Accordingly as the viscosity is higher than 1,000 Pa·sec, the material becomes further disadvantageous in view of spread.

However, on the other hand, upon application to a plurality of devices, an error occurs in which, in the case where the viscosity is low, the filler is unintentionally leaked from the syringe of the dispenser during the time of no application work between intervals of application for every device, and the filler is dripped onto a portion on which no application is desired. Therefore, in the static state in which no filler is extruded from the syringe, in the case where the viscosity of the filler material is less than 100 Pa·sec, work is difficult. Accordingly, the viscosity is preferably as high as possible, and further preferably 1,000 Pa·sec or more.

Moreover, higher static viscosity is advantageous also in view of suppressing an error of spilling or oozing of the filler material of the present invention upon conveying the already applied filler material of the present invention from an application step to a next step. In addition, the next step is, for example, a step of lamination between the dam material and the counter substrate.

Technical requirements are contradictory for the dynamic viscosity upon extruding the filler material of the present invention from the syringe, and the static viscosity upon no extrusion, and this contradiction is unsolvable with the filler of the Newtonian fluid in several cases. In the present invention according to which the above-mentioned contradiction can be solved by using the filler material of the non-Newtonian fluid to cause a change in the viscosity by a shear flow rate, both of contradictory flow characteristics of low viscosity in the dynamic state and high viscosity in the static state can be satisfied. As a result, realization of excellent working efficiency in an OLED sealing step including the application step by the dispenser or the like has been allowed. Above all, a thixotropic liquid having time and velocity dependence in the viscosity is particularly preferred in view of ease of spread without any defect on the insulating protective layer.

After the filler material of the present invention is filled thereinto, the resultant filled material is allowed to stand until the filler material spreads under the above-described temperature and atmosphere. At this time, the material may be left to stand or provided with vibration or the like. Thus, the filler material of the present invention can be cast without any defect on a surface of the insulating protective layer.

Thus, the filler material of the present invention is allowed to cast, and filled into the space between the laminate including the light-emitting part, and the dam material.

After the filler material of the present invention is filled thereinto, a step of adhering the counter substrate onto the dam material to seal the laminate is performed. Thus, the OLED element is sealed to produce the OLED element.

Thus, in the case where the filler material of the present invention is used, the OLED element can be produced with a high production yield.

EXAMPLES

The present invention will be described in more detail based on examples given below, but the invention is not meant to be limited by these.

Example 1

Polyisobutylene being liquid at room temperature ("015N" (trade name), the number average molecular weight: 600, iodine value: 40 g/100 g, manufactured by NOF Corporation), a toluene 50% solution of hydrogenated C5/C9 petroleum resin ("I-MARV P100" (trade name), the number average molecular weight: 900, iodine value<10 g/100 g, manufactured by Idemitsu Kosan Co., Ltd.) and a toluene 50% solution of aluminum triisononyloxide were mixed at a mass ratio of 2:3:1, and then the resultant mixture was dried under reduced pressure at 80° C. for 1 hour by using an evaporator.

Thus, a filler material for an OLED of the present invention was prepared. This filler material for an OLED was liquid at 25° C.

The prepared filler material for an OLED was filled into an airtight vessel for sealing a light-emitting part covered with an insulating protective layer, and an OLED element 1 similar to the OLED element shown in FIG. 1 was produced.

As element substrates 2, two kinds of ITO vapor-deposited glass having a size of 3.6 cm×3.6 cm and a size of 5.6 cm×5.6 cm were used, and these element substrates 2 were respectively subjected to etching by a photoresist method and to patterning into a predetermined pattern shape, to form a 100 nm-thick anode 11. In addition, part of ITO film was drawn to an end portion of the element substrate 2, and connected to a driving circuit (not shown).

Next, on an upper surface of the anode 11, a film of a hole injection layer 21 formed of copper phthalocyanine (CuPc) was formed at a film thickness of 70 nm by a resistance heating method, and on an upper surface of the hole injection layer 21, a film of a hole transport layer 22 formed of bis[N-(1-naphthyl)-N-phenyl]benzidine (α-NPD) was formed at a film thickness of 30 nm. Further, on an upper surface of the hole transport layer 22, a film of a light-emitting layer 23 formed of a tris(8-quinolinolato)aluminum complex was formed at a film thickness of 50 nm.

Subsequently, on an upper surface of the light-emitting layer 23, a film of an electron transport layer 24 formed of lithium fluoride was formed at a film thickness of 7 nm, and further on the electron transport layer 24, a film of a cathode 13 was formed at a film thickness of 150 nm by performing physical vapor deposition of aluminum. In addition, part of the cathode 13 was drawn to an end portion of the element substrate 2, and connected to a driving circuit (not shown). Thus, the element substrate 2 on which the light-emitting part 3 including the anode 11, the OLED layer 12 and the cathode 13 was mounted was obtained.

Subsequently, on a surface of the light-emitting part 3, as described below, a film of the insulating protective layer 14 having three layered structure including an inorganic thin layer formed of a compound containing at least a silicon atom and a nitrogen atom was formed to form as a laminate the light-emitting part 3 covered with the insulating protective layer 14.

The film of the insulating protective layer 14 corresponding to the three-layered structure of inorganic thin layer $14A_1$/flattening layer 14B/inorganic thin layer $14A_2$ was formed. First, on the surface of the light-emitting part 3, the 1 nm-thick inorganic thin layer $14A_1$ formed of silicon nitride was formed by a plasma CVT method, and then the mixture obtained by mixing 2,2-diethoxy acetophenone to butyl acrylate at a ratio of 0.1 mass % was applied at a thickness of 2 µm by spin coating, and then the resultant applied mixture was cured by irradiation with UV to form the flattening layer 14B. Then, the 1 nm thick-inorganic thin layer $14A_2$ formed of silicon nitride was formed again by a plasma CVT method to form the film of the insulating protective layer 14 having three layered structure.

A bisphenol A epoxy resin ("RE310S" (trade name), manufactured by Nippon Kayaku Co., Ltd.), silica particles ("SO-C1" (trade name), manufactured by Admatechs Co., Ltd.) and an optical cation catalyst ("Adekaoptomer SP170" (trade name), manufactured by ADEKA Corporation) were mixed at a mass ratio of 100:30:1 by using a planetary mixer to prepare a photocurable dam material.

Figure 2:
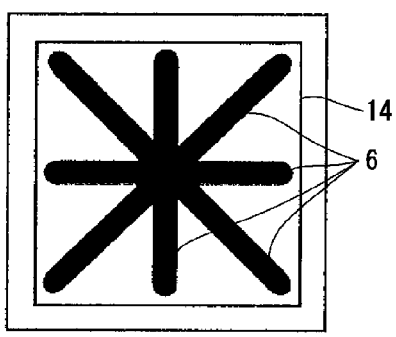
FIG. 2 is a top view showing an application aspect of a filler material in Examples and Comparative Examples.

Subsequently, in a glove box in which an atmosphere was replaced by a nitrogen gas having a dew point of −76° C. or lower, the thus prepared dam material was applied, by a dispenser, onto a periphery of the element substrate 2 on which the laminate was mounted so as to surround the laminate in a frame shape and to be 3 mm in width and 40 µm in height. Next, a filler material for an OLED in a volume equal to the volume of the space of the airtight vessel formed of the element substrate 2 and an uncured dam material was applied, by a dispenser, onto a surface of the laminate. As shown in FIG. 2, the filler material 6 for an OLED was applied onto a surface of the insulating protective layer 14 in a cross shape and an oblique cross shape.

Then, the resultant applied material was allowed to stand in the glove box for 2 minutes to spread the filler material for an OLED thereon. Next, a counter substrate 4 was laminated on a dam material 5, and then irradiated with ultraviolet light to cure the dam material 5. The dam material 5 was cured to fill the filler material 6 for an OLED, in keeping a liquid state, into the airtight vessel formed of the dam material 5, the counter substrate 4 and the element substrate 2 and for sealing the light-emitting part 3 covered with the insulating protective layer 14.

Thus, two kinds of the OLED elements 1 having a different size and having sealed structure of filling the filler material 6 for the OLED into the airtight vessel in keeping the liquid state were produced.

Example 2

Polyisobutylene being liquid at room temperature ("3N" (trade name), the number average molecular weight: 720, iodine value: 35 g/100 g, manufactured by NOF Corporation), a toluene 50% solution of hydrogenated C5/C9 petroleum resin ("I-MARV P100" (trade name), the number average molecular weight: 900, iodine value<10 g/100 g, manufactured by Idemitsu Kosan Co., Ltd.), and a toluene 50% solution of aluminum tri(4,6-nonanedionate) were mixed at a mass ratio of 2:3:1, and then the resultant mixture was dried under reduced pressure at 80° C. for 1 hour by using an evaporator. To the thus obtained composition, synthetic smectite particles ("LUCENTITE SAN" (trade name), mean particle diameter: 40 nm, manufactured by Co-op Chemical Co., Ltd.) were added to be in a 3% mass fraction, and dispersed by using a homogenizer.

Thus, a filler material for an OLED of the present invention was prepared. This filler material for an OLED was liquid at 25° C.

Two kinds of the OLED elements 1 having a different size were produced by using this filler material for the OLED in the same manner as Example 1.

Example 3

Polyisobutylene ("3N" (trade name), the number average molecular weight: 720, iodine value: 35 g/100 g, manufactured by NOF Corporation), a toluene 50% solution of hydrogenated C5/C9 petroleum resin ("I-MARV P100" (trade name), the number average molecular weight: 900, iodine value<10 g/100 g, manufactured by Idemitsu Kosan Co., Ltd.), and a toluene 50% solution of aluminum tri(4,6-decanedionate) were mixed at a mass ratio of 2:3:1, and then the resultant mixture was dried under reduced pressure at 80° C. for 1 hour by using an evaporator. To the thus obtained composition, nano-type fumed silica particles ("AEROSIL RX 50" (trade name), the mean particle diameter: 60 nm, manufactured by Nippon Aerosil Co., Ltd.) were added to be in a 3% mass fraction, and dispersed by using a homogenizer.

Thus, a filler material for an OLED of the present invention was prepared. This filler material for an OLED was liquid at 25° C.

Two kinds of the OLED elements 1 having a different size were produced by using this filler material for the OLED in the same manner as Example 1.

Example 4

A filler material for an OLED of the present invention was prepared in the same manner as Example 3 except that aluminum tri(diisopropyl malonate) was used in place of aluminum tri(4,6-decanedionate). This filler material for an OLED was liquid at 25° C.

Two kinds of the OLED elements 1 having a different size were produced by using this filler material for the OLED in the same manner as Example 1.

Example 5

Polyisobutylene ("3N" (trade name), the number average molecular weight: 720, iodine value: 35 g/100 g, manufactured by NOF Corporation), a toluene 50% solution of hydrogenated C5/C9 petroleum resin ("I-MARV P100" (trade name), the number average molecular weight: 900, iodine value<10 g/100 g, manufactured by Idemitsu Kosan Co., Ltd.), a toluene 50% solution of aluminum tristearyloxide and a toluene 50% solution of tri(tetrahydroabietic acid)glyceryl were mixed at a mass ratio of 4:6:4:1, and then the resultant mixture was dried under reduced pressure at 80° C. for 1 hour by using an evaporator. To the thus obtained composition, nano-type fumed silica particles ("AEROSIL RX 50" (trade name), the mean particle diameter: 60 nm, manufactured by Nippon Aerosil Co., Ltd.) were added to be in a 3% mass fraction, and dispersed by using a homogenizer.

Thus, a filler material for an OLED of the present invention was prepared. This filler material for an OLED was liquid at 25° C.

Two kinds of the OLED elements 1 having a different size were produced by using this filler material for the OLED in the same manner as Example 1.

Example 6

A filler material for an OLED of the present invention was prepared in the same manner as Example 5 except that aluminum triisodecyloxide was used in place of aluminum tristearyloxide. This filler material for an OLED was liquid at 25° C.

Two kinds of the OLED elements 1 having a different size were produced by using this filler material for the OLED in the same manner as Example 1.

Example 7

A filler material for an OLED of the present invention was prepared in the same manner as Example 6 except that nano-type spherical silica particles ("ST" (trade name), mean particle diameter: 15 nm, manufactured by Nissan Chemical Industries, Ltd.) was used in place of nano-type fumed silica particles. This filler material for an OLED was liquid at 25° C.

Two kinds of the OLED elements 1 having a different size were produced by using this filler material for the OLED in the same manner as Example 1.

Example 8

A filler material for an OLED of the present invention was prepared in the same manner as Example 6 except that a hydrogenated C9 petroleum resin ("ARKON P90" (trade name), the number average molecular weight: 600, iodine value<10 g/100 g, manufactured by Arakawa Chemical Industries, Ltd.) was used in place of the hydrogenated C5/C9 petroleum resin, and synthetic smectite particles ("LUCENTITE SAN" (trade name), mean particle diameter: 40 nm, manufactured by Co-op Chemical Co., Ltd.) was used in place of the nano-type fumed silica particles. This filler material for an OLED was liquid at 25° C.

Two kinds of the OLED elements 1 having a different size were produced by using this filler material for the OLED in the same manner as Example 1.

Example 9

A filler material for an OLED of the present invention was prepared in the same manner as Example 5 except that a hydrogenated terpene resin ("Clearon P105" (trade name), the number average molecular weight: 600, iodine value<10 g/100 g, manufactured by YASUHARA CHEMICAL Co., Ltd.), was used in place of the hydrogenated C5/C9 petroleum resin, and calcium diisononyloxide was used in place of aluminum triisostearyloxide. This filler material for an OLED was liquid at 25° C.

Two kinds of the OLED elements 1 having a different size were produced by using this filler material for the OLED in the same manner as Example 1.

Example 10

A filler material for an OLED of the present invention was prepared in the same manner as Example 6 except that partially hydrogenated polyisoprene ("kuraprene LIR-290" (trade name), the number average molecular weight: 31000, iodine value: 40 g/100 g, manufactured by KURARAY Co., Ltd.) was used in place of the polyisobutylene. This filler material for an OLED was liquid at 25° C.

Two kinds of the OLED elements 1 having a different size were produced by using this filler material for the OLED in the same manner as Example 1.

Example 11

Polyisobutylene ("015N" (trade name), the number average molecular weight: 600, iodine value: 40 g/100 g, manufactured by NOF Corporation), a toluene 50% solution of hydrogenated C5/C9 petroleum resin ("I-MARV P100" (trade name), the number average molecular weight: 900, iodine value<10 g/100 g, manufactured by Idemitsu Kosan Co., Ltd.) and a toluene 50% solution of aluminum triisononyloxide were mixed at a mass ratio of 4:1:3, and then the resultant mixture was dried under reduced pressure at 80° C. for 1 hour by using an evaporator.

Two kinds of the OLED elements 1 having a different size were produced by using this filler material for the OLED in the same manner as Example 1.

Comparative Example 1

A filler material was prepared by drying, under reduced pressure, polyisobutylene ("015N" (trade name), the number average molecular weight: 600, iodine value: 40 g/100 g, manufactured by NOF Corporation) at 80° C. for 1 hour by using an evaporator.

Two kinds of the OLED elements having a different size were produced by using this filler material in the same manner as Example 1.

Comparative Example 2

Two kinds of the OLED elements having a different size were produced by using aluminum triisononyloxide as a filler material in the same manner as Example 1.

Comparative Example 3

A toluene 50% solution of a styrene-isoprene-butadiene copolymer ("LIR-310" (trade name), the number average molecular weight: 32000 manufactured by KURARAY Co., Ltd.) and a toluene 50% solution of aluminum triisononyloxide were mixed at a mass ratio of 4:1, and then the resultant mixture was dried under reduced pressure at 80° C. for 1 hour by using an evaporator.

Thus, a filler material for an OLED was prepared. This filler material was solid at 25° C., and therefore an item other than the amount of outgassing was unable to be evaluated.

Accordingly, an OLED element was unable to be produced by using this filler material in the same manner as Example 1.

Comparative Example 4

A toluene 50% solution of polyisobutylene ("015N" (trade name), the number average molecular weight: 600, iodine value: 40 g/100 g, manufactured by NOF Corporation) and aluminum tri(normal-butyloxide) were mixed at a mass ratio of 3:1, and then the resultant mixture was dried under reduced pressure at 80° C. for 1 hour by using an evaporator.

Thus, a filler material for an OLED was prepared. This filler material for an OLED was liquid at 25° C.

Two kinds of the OLED elements 1 having a different size were produced by using this filler material for the OLED in the same manner as Example 1.

Comparative Example 5

A toluene 50% solution of polyisobutylene ("015N" (trade name), the number average molecular weight: 600, iodine value: 40 g/100 g, manufactured by NOF Corporation) and aluminum mono(diisopropylmalonate) di(normal-butyloxide) were mixed at a mass ratio of 3:1, and then the resultant mixture was dried under reduced pressure at 80° C. for 1 hour by using an evaporator.

Thus, a filler material for an OLED was prepared. This filler material for an OLED was liquid at 25° C.

Two kinds of the OLED elements 1 having a different size were produced by using this filler material for the OLED in the same manner as Example 1.

Comparative Example 6

A toluene 50% solution of polyisobutylene ("015N" (trade name), the number average molecular weight: 600, iodine value: 40 g/100 g, manufactured by NOF Corporation) and a toluene 50% solution of aluminum oxide octylate trimer were mixed at a mass ratio of 3:2, and then the resultant mixture was dried under reduced pressure at 40° C. for 1 hour by using an evaporator.

Thus, a filler material for an OLED was prepared. This filler material for an OLED was liquid at 25° C.

Two kinds of the OLED elements 1 having a different size were produced by using this filler material for the OLED in the same manner as Example 1.

(Fractal Dimension of Inorganic Particles)

For each of inorganic particles used in Examples, a projected image of the inorganic particles was obtained by using a transmission electron microscope (TEM), and then ten pieces of inorganic particles were randomly selected as a specimen, and a fractal dimension was determined, according to the following formula, from a contour line of each projected image by a box counting method.

$$\log(\text{length of the contour line}) = (1-D)\log(\text{resolution}) + \log(\text{constant})$$ Formula In the formula, $D$ represents a fractal dimension, and a "constant" represents an eigenvalue determined by a shape and a size of a contour line and corresponds to length upon approximating the contour line to the simplest shape. Complexity can be evaluated only by magnitude of the fractal dimension $D$, and magnitude of the "constant" has no relation with the complexity.

The fractal dimension of inorganic particles was taken as a mean value or a range including each value for 10 pieces.

Figure 3:
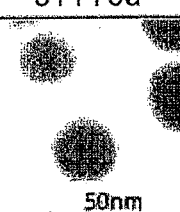
FIG. 3 is a table showing TEM images, mean particle sizes and fractal dimensions of contour lines of each of the different kinds of inorganic particles.
Figure 3:
Figure 3:
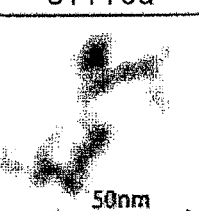

TEM images, mean particle sizes and fractal dimensions of contour lines of each of inorganic particles are shown in FIG. 3.

Each of the filler materials prepared or used in Examples and Comparative Examples was evaluated on the following items as described below.

(Contact Angle)

On a smooth wafer on a surface of which a silicon nitride film was formed by vacuum deposition, each of the filler materials in Examples and Comparative Examples was added dropwise to measure a contact angle between a dropped liquid and a silicon nitride film surface by a method in which the filler material was used in place of distilled water according to a sessile drop method specified in JIS R 3257.

(Amount of Outgassing)

For each of the filler materials in Examples and Comparative Examples, an amount of outgassing was measured by a gas chromatographic analysis method specified in JIS K 0114. A component volatilized upon heating each filler material at 85° C. for 1 hour was collected by using a headspace sampler and analyzed. As the amount of outgassing, an amount of a volatile component excluding moisture was determined in terms of a toluene equivalent.

(Total Luminous Transmittance)

Each of the filler materials in Examples and Comparative Examples was interposed between two sheets of 2 mm-thick polymethylmethacrylate resin (PMMA) plates (path length: 25 μm) together with a 25 μm-thick frame-shaped separator, and transmittance in the wavelength region of 350 to 800 nm was measured by using a visible-ultraviolet spectrophotometer "UV-3600" (manufactured by Shimadzu Corporation) by taking as a background (reference) a portion obtained by measuring the transmittance using only two sheets of PMMA plates. The thus obtained values were averaged, and taken as total luminous transmittance (expressed as "initial" in Table 2 and Table 3).

(Total Luminous Transmittance after Moisture Absorption)

Each of the filler materials in Examples and Comparative Examples was stored on a petri dish at 60° C. and relative humidity of 90% for 100 hours. With regard to each of the filler materials after moisture absorption, total luminous transmittance (expressed as "after moisture absorption" in Table 2 and Table 3) was determined in the same manner as the above-described "total luminous transmittance."

In addition, for storage at 60° C. for 100 hours under 90% RH, a constant temperature and humidity chamber (PR-1J, manufactured by ESPEC Corporation) was used.

(Viscosity)

For each of the filler materials in Examples and Comparative Examples, viscosity at 25° C. was measured by using a cone-plate type (E type) viscometer at each of shear rates of 0.1 $S^{-1}$, 10 $S^{-1}$ and 1,000 $S^{-1}$.

With regard to evaluation of viscosity, a case where the viscosity measured was different for every shear rate was evaluated to be non-Newtonian, and in particularly, a case where the viscosity decreased accordingly as the shear rate was increased was evaluated to be thixotropic for the filler material (expressed as "non-Newtonian thixotropy" in Table 2 and Table 3).

Moreover, a case where three kinds of viscosity measured at three kinds of shear rates were constant (equal value), more specifically a case where the shear rate and shear stress had a linear relationship was evaluated to be Newtonian.

(Evaluation of Oozing and Leak of Filler Material)

Whether or not oozing, leak or the like of a filler material to an outside of an airtight vessel was observed was evaluated.

Specifically, each of two kinds of an OLED elements produced in Examples and Comparative Examples, respectively, was observed from outside with naked eyes to confirm existence or non-existence of the oozing and the leak.

As evaluation criteria, one was taken as "A" in which neither the oozing nor the leak was confirmable in both an OLED element having an element substrate with a size of 3.6 cm×3.6 cm (referred to as a small-sized OLED element) and an OLED element having an element substrate with a size of 5.6 cm×5.6 cm (referred to as a large-sized OLED element), one was taken as "B" in which, while neither the oozing nor the leak was confirmable in the small-sized OLED element, the oozing and the leak were confirmable in the large-sized OLED element, and one was taken as "C" in which the oozing and the leak were confirmable even in the small-sized OLED element.

The evaluation of oozing and leak is testing for evaluating a contamination by the filler material, and as described later, the evaluation in the large-sized OLED element is severe testing as a test piece.

Accordingly, in the evaluation, a case of "B" in the evaluation criteria is an acceptable level, and a case of "A" is a desirable level as the filler material for an OLED.

(Evaluation of Gas Bubble-Like Defect and Unfilled Portion)

Each of the OLED elements produced was allowed to stand at 60° C. for 24 hours under a drying atmosphere of relative humidity of 0.003%, and then whether or not a gas bubble or a portion unwetted with the filler material (unfilled portion) inside an airtight vessel exists was observed through a microscope.

As evaluation criteria, one was taken as "A" in which neither the gas bubble-like defect nor the unfilled portion was confirmable in both a small-sized OLED element and a large-sized OLED element, one was taken as "B" in which, while neither the gas bubble-like defect nor the unfilled portion was confirmable in the small-sized OLED element, the gas bubble-like defect and the unfilled portion were confirmable in the large-sized OLED element, and one was taken as "C" in which the gas bubble-like defect and the unfilled portion were confirmable even in the small-sized OLED element.

The evaluation of the gas bubble-like defect and the unfilled portion is testing for evaluating wettability of the filler material and an influence on aesthetic appearance of a display.

In addition, although a large-sized one having a size of 5.6 cm×5.6 cm or more is not necessarily adopted in a case of an OLED element to be used in the form of a display for a digital clock or a portable music player, for example, the evaluation was conducted as severe testing in consideration of a possibility of producing such a large-sized one and a case of the OLED element used in other applications.

Accordingly, in the evaluation, a case of "B" in the evaluation criteria is an acceptable level, and a case of "A" is a desirable level as the filler material for an OLED.

(Occurrence of Dark-Spot)

Between two kinds of the OLED elements produced in Examples and Comparative Examples, high humidity and high temperature exposure testing was conducted in which each of small-sized OLED elements was allowed to stand for 500 to 1,000 hours under an environment of temperature of 60° C. and relative humidity of 90%. After elapse of 500 hours, 750 hours and 1,000 hours in exposure time, light was emitted from each small-sized OLED element, and a light-emitting state was observed through a microscope.

One in which no dark-spot was observed in the respective elapsed time was taken as an acceptable level "B," and one in which any dark-spot was observed was taken as "C."

In testing of the occurrence of a dark-spot, the evaluation at the elapsed time of 750 hours and 1,000 hours is severe testing (accelerated testing) because, for example, in the case of the OLED element used in various kinds of portable devices such as a digital clock and a portable music player, such a possibility is considered to be low under ordinary conditions that a user continuously uses and stores the device under a high humidity and high temperature environment of a temperature of 60° C. and humidity of 90% over one month or more.

Accordingly, a case of "B" in the evaluation at the elapsed time of 500 hours is an acceptable level. A case of "B" in the evaluation at the elapsed time of both 500 hours and 750 hours is a desirable level as the OLED element, and a case of "B" in the evaluation at the elapsed time of all of 500 hours, 750 hours and 1,000 hours is a particularly desirable level as the OLED element.

The results obtained are collectively shown in Table 2 and Table 3 below.

TABLE 2

| | | | Example 1 | Example 2 | Example 3 | Example 4 | Example 5 | Example 6 |
|---|---|---|---|---|---|---|---|---|
| | | | COMPOSITION | | | | | |
| Hydrocarbon polymer | Ingredient 1 | material | Polyisobutylene | Polyisobutylene | Polyisobutylene | Polyisobutylene | Polyisobutylene | Polyisobutylene |
| | | Mn | 600 | 720 | 720 | 720 | 720 | 720 |
| | | Content | 50.0% | 48.5% | 48.5% | 48.5% | 42.1% | 42.1% |
| | Ingredient 2 | material | Hydrogenated C5/C9 petroleum resin | Hydrogenated C5/C9 petroleum resin | Hydrogenated C5/C9 petroleum resin | Hydrogenated C5/C9 petroleum resin | Hydrogenated C5/C9 petroleum resin | Hydrogenated C5/C9 petroleum resin |
| | | Mn | 900 | 900 | 900 | 900 | 900 | 900 |
| | | Content | 37.5% | 36.4% | 36.4% | 36.4% | 31.6% | 31.6% |
| Alkyl ester of a hydrogenated product of organic acid derived from a pine resin fraction | | material | — | — | — | — | Tri(tetrahydroabietic acid) glyceryl | Tri(tetrahydroabietic acid) glyceryl |
| | | Content | — | — | — | — | 5.3% | 5.3% |

TABLE 2-continued

|  |  | | | | | | |
|---|---|---|---|---|---|---|---|
| Organometallic compound | Chemical formula | $Al(OC_9H_{19})_3$ | $Al(C_9H_{15}O_2)_3$ | $Al(C_{10}H_{17}O_2)_3$ | Al(diiso-propyl-malonate)$_3$ | $Al(OC_{18}H_{37})_3$ | $Al(OC_{10}H_{21})_3$ |
|  | Content | 12.5% | 12.1% | 12.1% | 12.1% | 21.0% | 21.0% |
| Inorganic particles | material | — | Smectite | Fumed silica | Fumed silica | Fumed silica | Fumed silica |
|  | Mean particle diameter | — | 40 nm | 60 nm | 60 nm | 60 nm | 60 nm |
|  | Fractal dimension | — | 1.1 | 1.3-1.4 | 1.3-1.4 | 1.3-1.4 | 1.3-1.4 |
|  | Content | — | 3.0% | 3.0% | 3.0% | 3.0% | 3.0% |

|  |  | | Example 7 | Example 8 | Example 9 | Example 10 | Example 11 |
|---|---|---|---|---|---|---|---|
| COMPOSITION | | | | | | | |
| Hydrocarbon polymer | Ingredient 1 | material | Polyisobutylene | Polyisobutylene | Polyisobutylene | partially hydrogenated polyisoprene | Polyisobutylene |
|  |  | Mn | 720 | 720 | 720 | 31000 | 600 |
|  |  | Content | 42.1% | 42.1% | 42.1% | 42.1% | 66.7% |
|  | Ingredient 2 | material | Hydrogenated C5/C9 petroleum resin | Hydrogenated C9 petroleum resin | Hydrogenated terpene resin | Hydrogenated C5/C9 petroleum resin | Hydrogenated C5/C9 petroleum resin |
|  |  | Mn | 900 | 600 | 600 | 900 | 900 |
|  |  | Content | 31.6% | 31.6% | 31.6% | 31.6% | 8.3% |
| Alkyl ester of a hydrogenated product of organic acid derived from a pine resin fraction | | material | Tri(tetrahydro-abietic acid) glyceryl | Tri(tetrahydro-abietic acid) glyceryl | Tri(tetrahydro-abietic acid) glyceryl | Tri(tetrahydro-abietic acid) glyceryl | — |
|  |  | Content | 5.3% | 5.3% | 5.3% | 5.3% | — |
| Organometallic compound | | Chemical formula | $Al(OC_{10}H_{21})_3$ | $Al(OC_{10}H_{21})_3$ | $Ca(OC_9H_{19})_2$ | $Al(OC_{10}H_{21})_3$ | $Al(OC_9H_{19})_3$ |
|  |  | Content | 21.0% | 21.0% | 21.0% | 21.0% | 25.0% |
| Inorganic particles | | material | Spherical silica | Smectite | Fumed silica | Fumed silica | — |
|  |  | Mean particle diameter | 15 nm | 40 nm | 60 nm | 60 nm | — |
|  |  | Fractal dimension | 1 | 1.1 | 1.3-1.4 | 1.3-1.4 | — |
|  |  | Content | 3.0% | 3.0% | 3.0% | 3.0% | — |

|  |  | | Example 1 | Example 2 | Example 3 | Example 4 | Example 5 | Example 6 |
|---|---|---|---|---|---|---|---|---|
| Characteristics | | | | | | | | |
| Contact angle (°) | | SiN | 30 | 36 | 36 | 25 | 35 | 39 |
| Amount of outgassing | | ppm | 100 | 50 | 50 | 50 | 50 | 40 |
| Total luminous transmittance (%) λ = 350-800 nm | | Initial | 94 | 78 | 93 | 94 | 98 | 97 |
|  | | After moisture absorption | 83 | 69 | 80 | 83 | 92 | 92 |
| Viscosity (Pa · s) | | @0.1 S$^{-1}$ | 520 | 740 | 1000 | 1300 | 900 | 1100 |
|  | | @10 S$^{-1}$ | 300 | 320 | 360 | 400 | 310 | 360 |
|  | | @1000 S$^{-1}$ | 70 | 12 | 5 | 8 | 3 | 7 |
|  | | Fluid | non-Newtonian thixotropy | non-Newtonian thixotropy | non-Newtonian thixotropy | non-Newtonian thixotropy | non-Newtonian thixotropy | non-Newtonian thixotropy |
| Evaluation results | | | | | | | | |
| Evaluation of oozing and leak | | | B | A | A | A | A | A |
| Evaluation of gas bubble-like defect and unfilled portion | | | A | A | A | A | A | A |
| Occurrence of dark-spot | | 500 h | B | B | B | B | B | B |
|  | | 750 h | B | B | B | B | B | B |
|  | | 1000 h | B | B | B | B | B | B |

|  |  | | Example 7 | Example 8 | Example 9 | Example 10 | Example 11 |
|---|---|---|---|---|---|---|---|
| Characteristics | | | | | | | |
| Contact angle (°) | | SiN | 37 | 40 | 40 | 34 | 39 |
| Amount of outgassing | | ppm | 50 | 50 | 50 | 500 | 200 |
| Total luminous transmittance (%) λ = 350-800 nm | | Initial | 98 | 92 | 90 | 95 | 94 |
|  | | After moisture absorption | 94 | 87 | 72 | 91 | 83 |
| Viscosity | | @0.1 S$^{-1}$ | 650 | 1100 | 810 | 2300 | 23 |

TABLE 2-continued

| (Pa · s) | @10 S⁻¹ | 300 | 430 | 380 | 810 | 23 |
| --- | --- | --- | --- | --- | --- | --- |
| | @1000 S⁻¹ | 45 | 13 | 5 | 48 | 23 |
| | Fluid | non-Newtonian thixotropy | non-Newtonian thixotropy | non-Newtonian thixotropy | non-Newtonian thixotropy | Newtonian |
| Evaluation results | | | | | | |
| Evaluation of oozing and leak | | A | A | A | A | B |
| Evaluation of gas bubble-like defect and unfilled portion | | A | A | A | A | B |
| Occurrence of dark-spot | 500 h | B | B | B | B | B |
| | 750 h | B | B | B | B | B |
| | 1000 h | B | B | C | C | B |

TABLE 3

| | | | Comparative Example 1 | Comparative Example 2 | Comparative Example 3 | Comparative Example 4 | Comparative Example 5 | Comparative Example 6 |
| --- | --- | --- | --- | --- | --- | --- | --- | --- |
| COMPOSITION | | | | | | | | |
| Hydrocarbon polymer | Ingredient 1 | material | Polyisobutylene | — | styrene-isoprene-butadiene copolymer | Polyisobutylene | Polyisobutylene | Polyisobutylene |
| | | Mn | 600 | — | 32000 | 600 | 600 | 600 |
| | | Content | 100.0% | — | 80.0% | 85.7% | 85.7% | 75.0% |
| | Ingredient 2 | material | — | — | — | — | — | — |
| | | Mn | — | — | — | — | — | — |
| | | Content | — | — | — | — | — | — |
| Alkyl ester of a hydrogenated product of organic acid derived from a pine resin fraction | | material | — | — | — | — | — | — |
| | | Content | — | — | — | — | — | — |
| Organometallic compound | | Chemical formula | — | Al(OC₉H₁₉)₃ | Al(OC₉H₁₉)₃ | Al(OC₄H₉)₃ | Al(dipropylmalonate)(OC₄H₉)₂ | Al₃O₃(OC₈H₁₇)₃ |
| | | Content | — | 100.0% | 20.0% | 14.3% | 14.3% | 25.0% |
| Inorganic particles | | material | — | — | — | — | — | — |
| | | Mean particle diameter | — | — | — | — | — | — |
| | | Fractal dimension | — | — | — | — | — | — |
| | | Content | — | — | — | — | — | — |

| | | Comparative Example 1 | Comparative Example2 | Comparative Example 3 | Comparative Example 4 | Comparative Example 5 | Comparative Example 6 |
| --- | --- | --- | --- | --- | --- | --- | --- |
| Characteristics | | | | | | | |
| Contact angle (°) | SiN | 23 | 71 | Not evaluated | 44 | 48 | 44 |
| Amount of outgassing | ppm | 200 | <100 | 200 | 1000 | 750 | 550 |
| Total luminous transmittance (%) λ = 350-800 nm | Initial | 98 | 96 | 83 | 95 | 95 | 94 |
| | After moisture absorption | 98 | 33 | 68 | 65 | 70 | 66 |
| Viscosity (Pa · s) | @0.1 S⁻¹ | 0.16 | 230 | Not evaluated | 4.0 | 10 | 3.0 |
| | @10 S⁻¹ | 0.16 | 120 | Not evaluated | 4.0 | 10 | 3.0 |
| | @1000 S⁻¹ | 0.16 | 30 | Not evaluated | 4.0 | 10 | 3.0 |
| | Fluid | Newtonian | non-Newtonian thixotropy | Solid | Newtonian | Newtonian | Newtonian |
| Evaluation results | | | | | | | |
| Evaluation of oozing and leak | | C | B | Not evaluated | C | C | C |
| Evaluation of gas bubble-like defect and unfilled portion | | A | C | Not evaluated | C | C | C |
| Occurrence of dark-spot | 500 h | C | B | Not evaluated | C | C | B |
| | 750 h | C | C | Not evaluated | C | C | B |
| | 1000 h | C | C | Not evaluated | C | C | C |

As is obvious from Table 2, all of the filler materials for an OLED in Examples were liquid at 25° C., and in the acceptable level in the evaluation of oozing and leak of the filler material, the evaluation of the gas bubble-like defect and the unfilled portion, and the occurrence of the dark-spot.

In addition, all of the filler materials for an OLED in Examples have no curability to cause no cure even during cure of the dam material, and are filled in keeping the liquid state. Accordingly, in production of the OLED element, a breakage risk of the OLED element due to cure shrinkage can be avoided.

Thus, it was found that the filler materials for an OLED in Examples protect the OLED element from moisture, have no breakage risk of the OLED element due to the cure shrinkage and can be applied and filled the into the element. Moreover, it was found that the filler materials can also be applied and filled onto the surface of the insulating protective layer for covering the light-emitting part or the like and formed of the inorganic substance without the gas bubble-like defect and the unfilled portion and also without leak and oozing.

In particular, in Examples 1 to 8, it was also found that no occurrence of the dark-spot was observed even if the element was allowed to stand for a period of time as long as 750 hours and 1,000 hours under high humidity and high temperature.

Moreover, it was also found that the OLED in which the dark-spot is hard to be occurred and visibility is excellent can be produced with a low level of a breakage risk during production and with a good production yield.

As is obvious from Table 3, all of the filler materials for an OLED in Comparative Examples were unacceptable in at least one of the evaluation of oozing and leak of the filler material, the evaluation of the gas bubble-like defect and the unfilled portion, and the occurrence of the dark-spot.

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

1 OLED element
2 Element substrate
3 light-emitting part
4 Counter substrate
5 Dam material
6 Filler material
11 Anode
12 OLED layer
13 Cathode
14 Insulating protective layer
    $14A_1$, $14A_2$ Inorganic thin layer
    14B Flattening layer
21 Hole injection layer
22 Hole transport layer
23 Light-emitting layer
24 Electron transport layer

The invention claimed is:

1. A filler material for an organic electroluminescent element, formed of a resin composition being liquid at 25° C., and containing a hydrocarbon polymer having a number average molecular weight of 300 or more and less than 32,000 and an organometallic compound represented by Formula 1;

wherein a contact angle to silicon nitride is 10 to 40 degrees, and an amount of outgassing other than moisture upon heating at 85° C. for 1 hour is 500 ppm or less in terms of a toluene equivalent;

$$M\text{-}L_n \qquad \text{Formula (1)}$$

wherein, in Formula (1), M represents a metal atom; L represents an organic group having 9 or more carbon atoms and 1 or more oxygen atoms, and all of L represent the same organic group; and n represents the valence of a metal atom M; and wherein the organic group L is an organic group derived from aliphatic alcohol.

2. The filler material for the organic electroluminescent element according to claim 1, wherein the metal atom M is a metal atom belonging to any one of group 2 to group 4 and group 11 to group 14 in the long periodic table of elements.

3. The filler material for the organic electroluminescent element according to claim 1, wherein at least one kind of the hydrocarbon polymer is polyisobutylene.

4. The filler material for the organic electroluminescent element according to claim 1, wherein at least one kind of the hydrocarbon polymer is a polymer of cyclic unsaturated hydrocarbon or a hydrogenated product thereof, having a number average molecular weight of 300 or more and less than 1,000.

5. The filler material for the organic electroluminescent element according to claim 1, wherein total luminous transmittance in a wavelength region of 350 to 800 nm is 90% or more at a path length of 25 μm.

6. The filler material for the organic electroluminescent element according to claim 5, wherein total luminous transmittance in a wavelength region of 350 to 800 nm after storage at 60° C. for 100 hours under an environment of 90% RH is 80% or more at a path length of 25 μm.

7. The filler material for the organic electroluminescent element according to claim 1, wherein the resin composition contains inorganic particles having a mean particle diameter of 10 to 60 nm in 1 mass % or more and 20 mass % or less.

8. The filler material for the organic electroluminescent element according to claim 7, wherein a fractal dimension of a contour line of a projected image per one particle of the inorganic particles is larger than 1.

9. The filler material for the organic electroluminescent element according to claim 1, wherein the resin composition contains alkyl ester of a hydrogenated product of organic acid derived from a pine resin fraction.

10. A method of sealing an organic electroluminescent element, including at least a step of filling the filler material for the organic electroluminescent element according to claim 1, into an airtight vessel in which a light-emitting part covered with an insulating protective layer is sealed.

11. A filler material for an organic electroluminescent element, formed of a resin composition being liquid at 25° C., and containing a hydrocarbon polymer having a number average molecular weight of 300 or more and less than 32,000 and an organometallic compound represented by Formula 1;

wherein a contact angle to silicon nitride is 10 to 40 degrees, and an amount of outgassing other than moisture upon heating at 85° C. for 1 hour is 500 ppm or less in terms of a toluene equivalent;

$$M\text{-}L_n \qquad \text{Formula (1)}$$

wherein, in Formula (1), M represents a metal atom; L represents an organic group having 9 or more carbon atoms and 1 or more oxygen atoms, and all of L represent the same organic group; and n represents the valence of a metal atom M; and wherein the organic group L is an organic group derived from β-diketone, β-ketoester or malonic diester.

12. The filler material for the organic electroluminescent element according to claim 11, wherein the metal atom M is a metal atom belonging to any one of group 2 to group 4 and group 11 to group 14 in the long periodic table of elements.

13. The filler material for the organic electroluminescent element according to claim 11, wherein at least one kind of the hydrocarbon polymer is polyisobutylene.

14. The filler material for the organic electroluminescent element according to claim 11, wherein at least one kind of the hydrocarbon polymer is a polymer of cyclic unsaturated hydrocarbon or a hydrogenated product thereof, having a number average molecular weight of 300 or more and less than 1,000.

15. The filler material for the organic electroluminescent element according to claim 11, wherein total luminous transmittance in a wavelength region of 350 to 800 nm is 90% or more at a path length of 25 μm.

16. The filler material for the organic electroluminescent element according to claim 15, wherein total luminous transmittance in a wavelength region of 350 to 800 nm after storage at 60° C. for 100 hours under an environment of 90% RH is 80% or more at a path length of 25 μm.

17. The filler material for the organic electroluminescent element according to claim 11, wherein the resin composition contains inorganic particles having a mean particle diameter of 10 to 60 nm in 1 mass % or more and 20 mass % or less.

18. The filler material for the organic electroluminescent element according to claim 17, wherein a fractal dimension of a contour line of a projected image per one particle of the inorganic particles is larger than 1.

19. The filler material for the organic electroluminescent element according to claim 11, wherein the resin composition contains alkyl ester of a hydrogenated product of organic acid derived from a pine resin fraction.

20. A method of sealing an organic electroluminescent element, including at least a step of filling the filler material for the organic electroluminescent element according to claim 11, into an airtight vessel in which a light-emitting part covered with an insulating protective layer is sealed.

* * * * *